(12) United States Patent
Hashimoto et al.

(10) Patent No.: US 8,021,806 B2
(45) Date of Patent: Sep. 20, 2011

(54) PHOTOMASK BLANK, PHOTOMASK, AND METHODS OF MANUFACTURING THE SAME

(75) Inventors: Masahiro Hashimoto, Shinjuku-ku (JP); Hideaki Mitsui, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 39 days.

(21) Appl. No.: 12/493,641

(22) Filed: Jun. 29, 2009

(65) Prior Publication Data

US 2009/0325084 A1    Dec. 31, 2009

(30) Foreign Application Priority Data

Jun. 30, 2008   (JP) .................................. 2008-170305

(51) Int. Cl.
*G03F 1/00*   (2006.01)
(52) U.S. Cl. .......................................................... 430/5
(58) Field of Classification Search ...... 430/5; 428/428, 428/430
See application file for complete search history.

(56) References Cited

U.S. PATENT DOCUMENTS

2003/0203290 A1 * 10/2003 Misaka .............................. 430/5
2007/0212618 A1 *  9/2007 Yoshikawa et al. ................ 430/5

FOREIGN PATENT DOCUMENTS

| JP | 2003-322947 A | 11/2003 |
| JP | 2005-148514 A | 6/2005 |
| JP | 2006-285122 A | 10/2006 |
| JP | 2007-241065 A | 9/2007 |
| JP | 2007-241136 A | 9/2007 |

* cited by examiner

*Primary Examiner* — Stephen Rosasco
(74) *Attorney, Agent, or Firm* — Sughrue Mion, PLLC

(57) ABSTRACT

A photomask blank for manufacturing a phase shift mask having a light-transmitting substrate provided with a phase shift part adapted to give a predetermined phase difference to transmitted exposure light. An etching mask film serving as an etching mask when forming a phase shift part is provided on the front surface side, where the phase shift part is to be formed, of the substrate. A light-shielding film serving to shield exposure light is provided on the back surface side (opposite-side surface) of the substrate.

18 Claims, 10 Drawing Sheets resist stripped

US 8,021,806 B2

PHOTOMASK BLANK, PHOTOMASK, AND METHODS OF MANUFACTURING THE SAME

This application is based upon and claims the benefit of priority from Japanese Patent Application No. 2008-170305, filed on Jun. 30, 2008, the disclosure of which is incorporated herein in its entirety by reference.

TECHNICAL FIELD

This invention relates to a photomask blank and a photomask for use in the manufacture of semiconductor devices or the like and further relates to methods of manufacturing them.

BACKGROUND ART

The miniaturization of semiconductor devices and the like is advantageous in bringing about an improvement in performance and function (higher-speed operation, lower power consumption, etc.) and a reduction in cost and thus has been accelerated more and more. The lithography technique has been supporting this miniaturization and transfer masks are a key technique along with exposure apparatuses and resist materials.

In recent years, the development of the half-pitch (hp) 45 nm to 32 nm generations according to the semiconductor device design rule has been progressing. This corresponds to ¼ to ⅙ of a wavelength 193 nm of ArF excimer laser exposure light (hereinafter referred to as "ArF exposure light"). Particularly, in the hp45 nm and subsequent generations, only the application of the resolution enhancement technology (RET) such as the conventional phase shift method, oblique illumination method, and pupil filter method and the optical proximity correction (OPC) technique has been becoming insufficient, and the hyper-NA technique (immersion lithography) and the double exposure (double patterning) technique have been becoming necessary.

In the meantime, circuit patterns necessary in the semiconductor manufacture are exposed in sequence onto a semiconductor wafer by a plurality of photomask (reticle) patterns. For example, a reduced projection exposure apparatus with a predetermined reticle set therein repeatedly projects and exposes patterns while sequentially shifting projection regions on a semiconductor wafer (step-and-repeat system), or repeatedly projects and exposes patterns while synchronously scanning the reticle and a semiconductor wafer with respect to a projection optical system (step-and-scan system). By this, a predetermined number of integrated circuit chip regions are formed in the semiconductor wafer.

A photomask (reticle) has a region formed with a transfer pattern and a peripheral region thereof, i.e. an edge region along four sides in the photomask (reticle). When exposing the transfer pattern of the photomask (reticle) while sequentially shifting projection regions on a semiconductor wafer, the transfer pattern is exposed and transferred onto the projection regions so that the photomask peripheral regions overlap each other for the purpose of increasing the number of integrated circuit chips to be formed. In order to prevent exposure of a resist on the wafer due to such overlapping exposure, a light-shielding band (light-shielder band or light-shielder ring) is formed in the peripheral region of the photomask by mask processing.

The phase shift method is a technique of giving a predetermined phase difference to exposure light transmitted through a phase shift part, thereby improving the resolution of a transfer pattern using interference of light.

As photomasks improved in resolution by the phase shift method, there are a substrate dug-down type in which a shifter part is provided by digging down a quartz substrate by etching or the like, and a type in which a shifter part is provided by patterning a phase shift film formed on a substrate.

DISCLOSURE OF THE INVENTION

As one of photomasks of the substrate dug-down (carved) type, there is a chromeless phase shift mask. As chromeless phase shift masks, there are a type in which a light-shielding layer at a non-dug-down part is completely removed, and a type in which a light-shielding layer at a non-dug-down part is patterned (so-called zebra type). A chromeless phase shift mask of the type in which a light-shielding layer in a transfer region is completely removed is also called an alternative phase shifter which is a phase shift mask of the type in which exposure light incident on a phase shift part is transmitted at approximately 100%. In either type, it is necessary to form a light-shielding band in an edge region along four sides in the photomask (reticle), i.e. a peripheral region (blind region) around a transfer pattern region.

As a photomask blank for fabricating such a chromeless phase shift mask, there is known one in which a CrO/Cr light-shielding film comprising a light-shielding layer made of Cr and a low reflection layer made of CrO stacked together is formed on a transparent substrate and has a total thickness of 70 nm to 100 nm (see, e.g. Japanese Unexamined PatentApplication Publication (JP-A) No. 2007-241136 (Patent Document 1), paragraph [0005]). In manufacturing processes of the chromeless phase shift mask, the substrate is dug down using a light-shielding film pattern as an etching mask and, after removing a resist pattern used for forming the light-shielding film pattern, a resist is coated again and subjected to exposure and development so as to protect a portion where the light-shielding film is to remain, and then the light-shielding film at an unnecessary portion is removed by etching, thereby obtaining the photomask having a light-shielding band in the substrate peripheral region (blind region) and a light-shielding pattern in the transfer pattern region according to need. That is, the light-shielding film has both a function as an etching mask (also called a hard mask) and a function as a layer for forming the light-shielding band and the light-shielding pattern (function of ensuring the light-shielding performance).

Generally, in order to improve the CD performance of a photomask, it is effective to reduce the thickness of a light-shielding film and the thickness of a resist for forming the light-shielding film. However, if the thickness of the light-shielding film is reduced, the OD value (optical density) decreases. In the case of the above CrO/Cr light-shielding film, the total thickness of about 60 nm is required at minimum for achieving OD=3 which is generally required, and thus, it is difficult to significantly reduce the thickness thereof. If the thickness of the light-shielding film cannot be reduced, it is also not possible to reduce the thickness of the resist due to the etching selectivity between the light-shielding film and the resist. Thus, a significant improvement in CD cannot be expected.

As a measure for this, Patent Document 1 proposes a method. This method is intended to satisfy the above requirement by forming a light-shielding layer and an etching mask layer of different materials.

In the method of Patent Document 1, the layer structure is, for example, substrate/Cr-based second etching mask film/ MoSi-based light-shielding film/Cr-based first etching mask film (also serving as an antireflection film) and thus a Cr-based material is used as the first etching mask film at the outermost surface farthest from the substrate (see Patent Document 1, paragraph [0038] etc.). By this, a resist film to be coated on the upper surface of the first etching mask film is only required, at minimum, to transfer a pattern to the first etching mask film and thus a reduction in thickness of the resist film can be achieved to some degree. However, the first etching mask film of the Cr-based material should be dry-etched with a mixed gas of chlorine and oxygen and thus the etching selectivity to the resist is low (etching amount of the resist is large). Therefore, there is a problem that it is difficult to significantly reduce the thickness of the resist film (to realize a resist film thickness of 200 nm or less and further 150 nm or less) and the CD accuracy cannot be said to be sufficient, and therefore, it is difficult to realize high accuracy with a mask pattern resolution of about 65 nm or less and further 50 nm or less.

Further, in the method of Patent Document 1, the layer structure is such that the two Cr-based etching mask films are provided above and below the MoSi-based light-shielding film, and therefore, there is a problem that the processes of manufacturing the photomask blank become complicated.

Further, there is also a problem that the processing of the photomask blank becomes complicated because the number of layers is large. For example, in this method, it is necessary to use the photomask blank having the layer structure of substrate/Cr-based second etching mask film/MoSi-based light-shielding film/Cr-based first etching mask film (also serving as an antireflection film) (see Patent Document 1, paragraph [0038] etc.), and therefore, there is a problem that the processing of the photomask blank becomes complicated due to a large number of layers.

The above description also applies to the case of using a photomask blank having a layer structure of, for example, substrate/MoSi-based phase shift film/Cr-based second etching mask film/MoSi-based light-shielding film/Cr-based first etching mask film (also serving as an antireflection film) (see Japanese Unexamined Patent Application Publication (JP-A) No. 2007-241065 (Patent Document 2), paragraph [0174] etc.) and thus there is a problem that the processes of manufacturing the photomask blank and the processing thereof become complicated due to a large number of layers.

An object of this invention is both to achieve a reduction in thickness of an etching mask layer and to ensure the degree of freedom in optical density design of a light-shielding band, which are necessary for the DRAM half-pitch (hp) 45 nm and subsequent generations, particularly the 32 nm to 22 nm generations, in the semiconductor design rule.

It is an object of this invention to provide a photomask blank and a photomask that can achieve, with a small number of layers, the following three subjects (1) to (3):
(1) The shift amount of CD (Critical Dimension) of a to-be-etched layer with respect to CD of an etching mask layer (the size change amount of the pattern size of a to-be-etched layer with respect to the pattern size of an etching mask layer) is less than 5 nm;
(2) The optical density of a light-shielding band is OD≧3; and
(3) The resolution of a pattern on a photomask is 50 nm or less.

The present inventors have found that the above objects can be achieved not by forming a light-shielding layer and an etching mask layer by laminated layers of different materials like in the method described in Patent Document 1, but by providing a light-shielding function on the back surface side of a substrate (e.g. providing, on the back surface side of a substrate, a layer exclusively used for forming a light-shielding band), and has completed this invention.

A conventional method described in Japanese Unexamined Patent Application Publication (JP-A) No. 2006-285122 (Patent Document 3), paragraph [0008] relates to a double-sided mask for hologram formation in which both surfaces of a substrate are dug down, and thus the subject thereof is completely different from that of this invention. The method described in Patent Document 3 or a method described in Japanese Unexamined Patent Application Publication (JP-A) No. 2005-148514 (Patent Document 4) teaches nothing about providing an etching mask film for digging down a substrate or an etching mask film for processing a phase shift film. Either of the methods described in Patent Document 3 and Patent Document 4 relates to a technique in which, in order to reduce the thickness of a light-shielding film on the upper surface of a substrate and to satisfy a predetermined light-shielding function, the light-shielding film is provided on both surfaces of the substrate, thereby satisfying the predetermined light-shielding function by the light-shielding films on both surfaces of the substrate so as to reduce the thickness of each light-shielding film than conventional. In either method, the same transfer pattern is formed in the light-shielding films on both surfaces of the substrate. Accordingly, either method is quite different from the structure of this invention in which an etching mask film serving as an etching mask is provided on the front surface side of a substrate and a light-shielding film having a sufficient light-shielding function alone is provided on the back surface side of the substrate.

This invention has the following Structures.
(Structure 1)

A photomask blank for manufacturing a phase shift mask having a light-transmitting substrate provided with a phase shift part adapted to give a predetermined phase difference to transmitted exposure light, wherein the phase shift part is a dug-down part that is dug down from a surface of the light-transmitting substrate to a digging depth adapted to produce the predetermined phase difference with respect to exposure light transmitted through the light-transmitting substrate at a portion where the phase shift part is not provided, the photomask blank comprising:

an etching mask film, on the digging-side surface of the light-transmitting substrate, that is made of a material being dry-etchable with a chlorine-based gas, but not dry-etchable with a fluorine-based gas, and serves as an etching mask at least until the digging depth is reached when forming the dug-down part; and a light-shielding film, on an opposite-side surface of the light-transmitting substrate, that forms, by etching, a light-shielding part adapted to shield exposure light transmitted through the light-transmitting substrate in a region other than a transfer pattern region.
(Structure 2)

A photomask blank for manufacturing a phase shift mask having a light-transmitting substrate provided with a phase shift part adapted to give a predetermined phase difference to transmitted exposure light, wherein the phase shift part is a phase shift film adapted to give a predetermined phase change amount to the transmitted exposure light, the photomask blank comprising:

an etching mask film, on a surface of the phase shift film, that is made of a material being dry-etchable with a chlorine-based gas, but not dry-etchable with a fluorine-based gas, and serves as an etching mask at least until a transfer pattern is formed in the phase shift film by dry etching with a fluorine-based gas; and a light-shielding film, on an opposite-side surface of the light-transmitting substrate, that forms, by etching, a light-shielding part adapted to shield exposure light transmitted through said light-transmitting substrate in a region other than a transfer pattern region.

(Structure 3)

The photomask blank according to Structure 1 or 2, wherein the light-shielding film is made of a material being wet-etchable with an etchant to which the light-transmitting substrate has etching resistance.

(Structure 4)

The photomask blank according to any one of Structures 1 to 3, wherein the light-shielding film is made of a material mainly containing one of chromium, chromium nitride, chromium oxide, chromium oxynitride, and chromium oxycarbonitride.

(Structure 5)

The photomask blank according to any one of Structures 1 to 4, wherein the light-shielding film has a thickness of 60 nm to 100 nm.

(Structure 6)

The photomask blank according to any one of Structures 1 to 5, wherein the etching mask film is made of a material mainly containing one of chromium, chromium nitride, chromium oxide, chromium oxynitride, and chromium oxycarbonitride.

(Structure 7)

The photomask blank according to any one of Structures 1 to 6, wherein the etching mask film has a thickness of 5 nm to 40 nm.

(Structure 8)

The photomask blank according to any one of Structures 2 to 7, wherein the phase shift film is made of a material mainly containing one of molybdenum silicide, molybdenum silicide nitride, molybdenum silicide oxide, and molybdenum silicide oxynitride.

(Structure 9)

The photomask blank according to any one of Structures 2 to 7, wherein the phase shift film comprises:

a phase adjusting layer made of a material mainly containing silicon oxide or silicon oxynitride; and a transmittance adjusting layer made of a material mainly containing tantalum or a tantalum-hafnium alloy.
any one of Structures 2 to 7.

(Structure 10)

A photomask manufactured using the photomask blank according to any one of Structures 1 to 9.

(Structure 11)

A photomask manufacturing method using the photomask blank according to Structure 1 or any one of Structures 3 to 9, the method comprising the steps of:

etching the light-shielding film using a resist film pattern as a mask, thereby forming the light-shielding part in the region other than the transfer pattern region;

dry-etching the etching mask film using a resist film pattern as a mask, thereby forming an etching mask film pattern; and dry-etching the light-transmitting substrate using the etching mask film pattern as a mask, thereby forming the dug-down part that is dug down from the surface of the light-transmitting substrate to the digging depth adapted to produce the predetermined phase difference.

(Structure 12)

A photomask manufacturing method using the photomask blank according to any one of Structures 2 to 9, the method comprising the steps of:

etching the light-shielding film using a resist film pattern as a mask, thereby forming the light-shielding part in the region other than the transfer pattern region;

dry-etching the etching mask film using a resist film pattern as a mask, thereby forming an etching mask film pattern; and dry-etching the phase shift film using the etching mask film pattern as a mask, thereby forming a phase shift film pattern.

According to this invention, since it is configured such that an etching mask film serving as an etching mask when forming a phase shift part is provided on the front surface side, where the phase shift part is to be formed, of a substrate and a light-shielding film serving to shield exposure light is provided on the back surface side of the substrate, the following effects can be achieved.

In the case of a conventional photomask blank having a structure in which a light-shielding film is stacked on the upper surface of an etching mask film, in order to transfer to the etching mask film a fine transfer pattern, to be transferred to a phase shift part (a dug-down part of a substrate or a phase shift film), formed in a resist film, it is necessary to first transfer the fine transfer pattern of the resist film to the light-shielding film and then to transfer the transfer pattern, transferred to the light-shielding film, to the etching mask film. Accordingly, the thickness of the light-shielding film is also a large factor affecting the CD accuracy of the transfer pattern and, therefore, it is necessary to carry out the transfer of the transfer pattern in multi-step etching processes by reducing the thickness of the light-shielding film or forming the light-shielding film to have a multilayer structure.

(i) By disposing a light-shielding film having a light-shielding function on the substrate back surface side, a resist film can be stacked on the upper surface of a thick etching mask film disposed on the substrate front surface side, which serves as an etching mask at least until a phase shift part is formed on the substrate front surface side, and therefore, a fine transfer pattern can be directly transferred to the etching mask film. Thus, it is possible to significantly improve CD and pattern resolution than conventional.

(ii) For a pattern of a light-shielding band, an alignment mark, or the like formed in a light-shielding film outside a transfer pattern region, high CD or pattern resolution as required for a pattern of a phase shift part is not required. Accordingly, by disposing a light-shielding film on the substrate back surface side, it is sufficient for the light-shielding film to minimally satisfy a predetermined light-shielding condition (OD≧3, 2.8, 2.5, etc.) required for forming a light-shielding band. Thus, the light-shielding film is not restricted by its thickness or material.

(iii) Since high CD or pattern resolution as required for a pattern of a phase shift part is not required for a pattern of a light-shielding band or the like formed in a light-shielding film, it is not necessary to perform multi-step etching of the light-shielding film by forming the light-shielding film by a plurality of layers made of materials having different etching selectivities. Accordingly, the number of processes for manufacturing a photomask from a photomask blank is reduced and thus a reduction in cost and labor can be achieved.

(iv) Since high CD or pattern resolution as required for a pattern of a phase shift part is not required for a pattern formed in a light-shielding film, wet etching can be used for forming a pattern of a light-shielding band or the like in the light-shielding film, thus resulting in low cost.

(v) An etching mask film on the substrate front surface side and a light-shielding film on the substrate back surface side can be made of the same material. Thus, the etching mask film and the light-shielding film can be formed even by a film forming apparatus having a single film forming chamber.

DETAILED DESCRIPTION OF THE INVENTION

Hereinbelow, this invention will be described in detail.

(Structure 1) A photomask blank for manufacturing a phase shift mask having a light-transmitting substrate provided with a phase shift part adapted to give a predetermined phase difference to transmitted exposure light, wherein the phase shift part is a dug-down part that is dug down from a surface of the light-transmitting substrate to a digging depth adapted to produce the predetermined phase difference with respect to exposure light transmitted through the light-transmitting substrate at a portion where the phase shift part is not provided, the photomask blank comprising:

an etching mask film, on the digging-side surface of the light-transmitting substrate, that is made of a material being dry-etchable with a chlorine-based gas, but not dry-etchable with a fluorine-based gas, and serves as an etching mask at least until the digging depth is reached when forming the dug-down part; and a light-shielding film, on an opposite-side surface of the light-transmitting substrate, that forms, by etching, a light-shielding part adapted to shield exposure light transmitted through the light-transmitting substrate in a region other than a transfer pattern region.

According to this structure, it is possible to provide a photomask having a phase shift part of the substrate dug-down type, that is capable of both achieving a reduction in thickness of an etching mask layer and ensuring the degree of freedom in optical density design of a light-shielding band, which are necessary for the DRAM half-pitch (hp) 45 nm and subsequent generations, particularly the 32 nm to 22 nm generations, in the semiconductor design rule.

In this invention, the photomask blank has a light-shielding film (hereinafter referred to as a "light-shielding film for shielding band formation", where appropriate), on the opposite-side surface (i.e. the back surface) of the light-transmitting substrate, that forms, by etching, a light-shielding part, i.e. a light-shielding band, adapted to shield exposure light transmitted through the light-transmitting substrate in a region other than a transfer pattern region.

Figure 1:
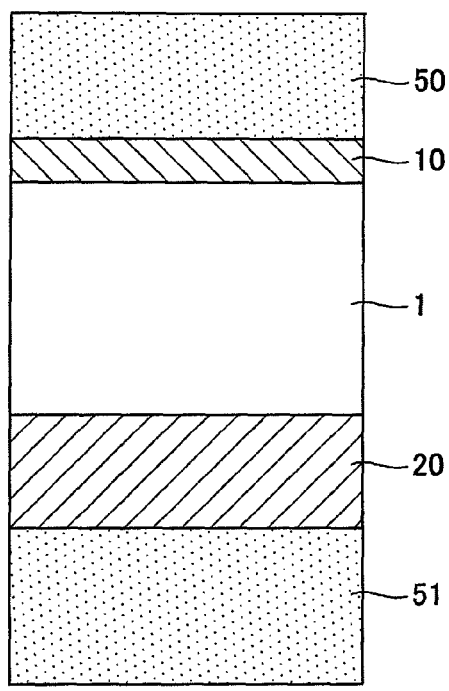
FIG. 1 is an exemplary sectional view showing one example of a photomask blank according to a first embodiment of this invention.

FIG. 1 shows one example of a photomask blank according to a first embodiment of this invention.

The photomask blank shown in FIG. 1 is used for manufacturing a phase shift mask of the substrate dug-down type.

This photomask blank comprises an etching mask film 10 and a resist film 50 formed in this order on the front surface (one surface) side of a transparent substrate 1 and further comprises a light-shielding film 20 for light-shielding band formation and a resist film 51 formed in this order on the back surface (other surface) side of the transparent substrate 1.

Figure 5A:
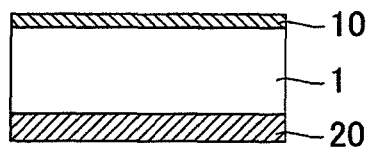
FIGS. 5A to 5I are exemplary sectional views for explaining photomask manufacturing processes according to Example 1 of this invention.
Figure 5F:
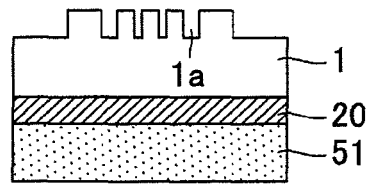
Figure 5B:
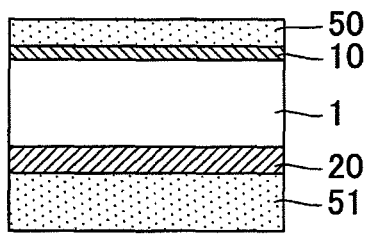
Figure 5G:
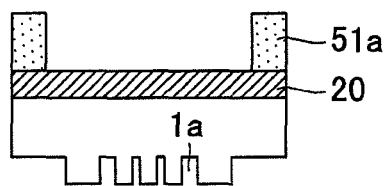
Figure 5C:
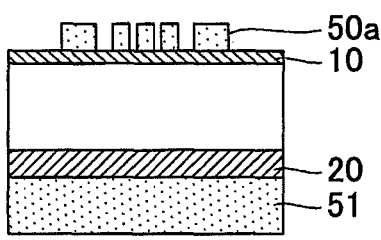
Figure 5H:
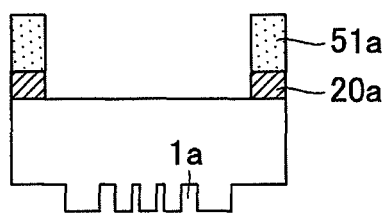
Figure 5D:
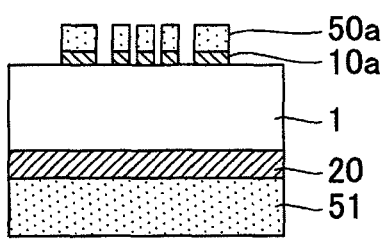
Figure 5I:
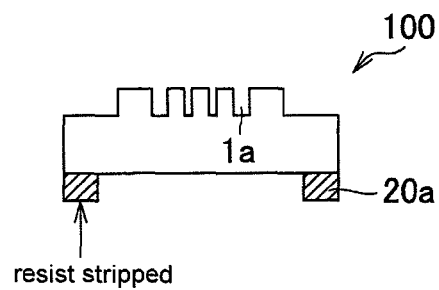

FIG. 5I shows one example of a phase shift mask of the substrate dug-down type.

(Structure 2) A photomask blank for manufacturing a phase shift mask having a light-transmitting substrate provided with a phase shift part adapted to give a predetermined phase difference to transmitted exposure light, wherein the phase shift part is a phase shift film adapted to give a predetermined phase change amount to the transmitted exposure light, the photomask blank comprising:

an etching mask film, on a surface of the phase shift film, that is made of a material being dry-etchable with a chlorine-based gas, but not dry-etchable with a fluorine-based gas, and serves as an etching mask at least until a transfer pattern is formed in the phase shift film by dry etching with a fluorine-based gas; and a light-shielding film, on an opposite-side surface of the light-transmitting substrate, that forms, by etching, a light-shielding part adapted to shield exposure light transmitted through said light-transmitting substrate in a region other than a transfer pattern region.

According to this structure, it is possible to provide a photomask having a phase shift part formed by patterning a phase shift film on a substrate, that is capable of both achieving a reduction in thickness of an etching mask layer and ensuring the degree of freedom in optical density design of a light-shielding band, which are necessary for the DRAM half-pitch (hp) 45 nm and subsequent generations, particularly the 32 nm to 22 nm generations, in the semiconductor design rule.

In this invention, the photomask blank has a light-shielding film, on the opposite-side surface (i.e. the back surface) of the light-transmitting substrate, that forms, by etching, a light-shielding part, i.e. a light-shielding band, adapted to shield exposure light transmitted through the light-transmitting substrate in a region other than a transfer pattern region.

Figure 2:
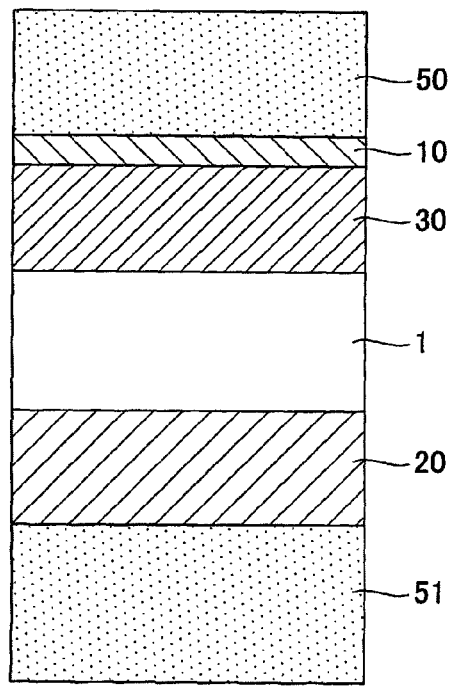
FIG. 2 is an exemplary sectional view showing one example of a photomask blank according to a second embodiment of this invention.

FIG. 2 shows one example of a photomask blank according to a second embodiment of this invention.

The photomask blank shown in FIG. 2 is used for manufacturing a phase shift mask of the type in which a substrate is not basically dug down and a phase shift part is formed by a halftone phase shift film.

This photomask blank comprises a halftone phase shift film 30, an etching mask film 10, and a resist film 50 formed in this order on the front surface side of a transparent substrate 1 and further comprises a light-shielding film 20 for light-shielding band formation and a resist film 51 formed in this order on the back surface side of the transparent substrate 1.

Figure 6A:
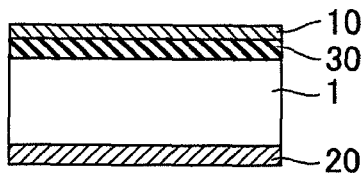
FIGS. 6A to 6I are exemplary sectional views for explaining photomask manufacturing processes according to Example 2 of this invention.
Figure 6F:
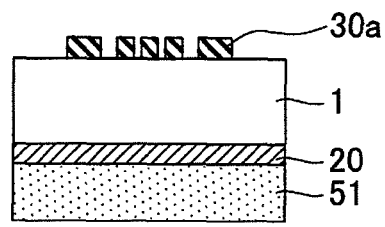
Figure 6B:
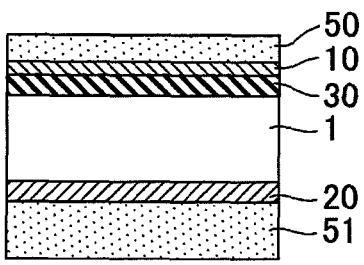
Figure 6G:
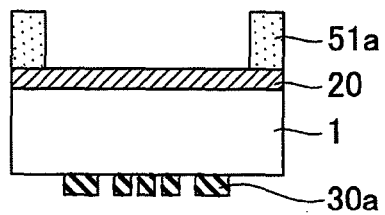
Figure 6C:
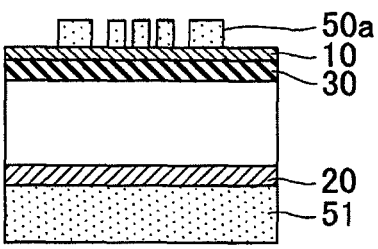
Figure 6H:
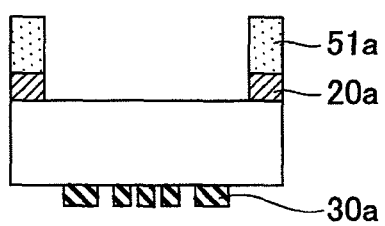
Figure 6D:
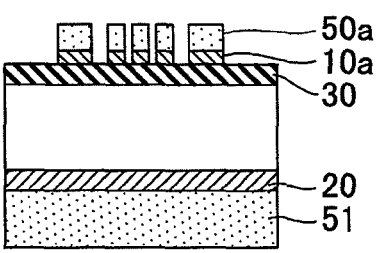
Figure 6I:
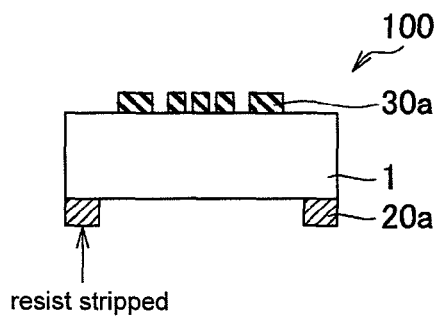

FIG. 6I shows one example of a phase shift mask of this type.

Figure 3:
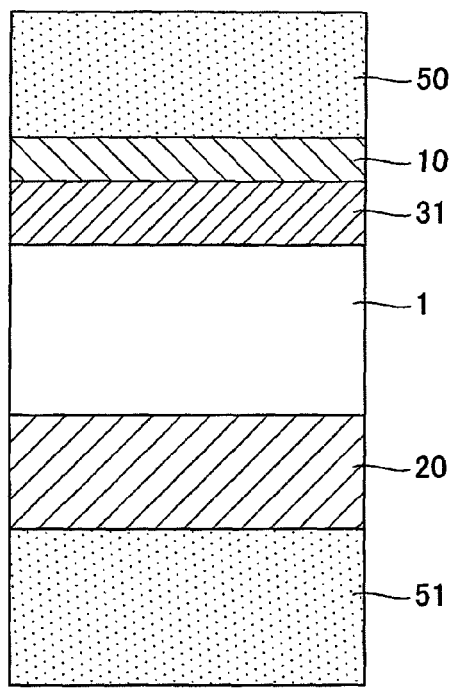
FIG. 3 is an exemplary sectional view showing one example of a photomask blank according to a third embodiment of this invention.

FIG. 3 shows one example of a photomask blank according to a third embodiment of this invention.

The photomask blank shown in FIG. 3 is used for manufacturing a phase shift mask of the type in which a high-transmittance phase shift part is formed by providing a halftone phase shift film and further by digging down a substrate.

This photomask blank comprises a halftone phase shift film 31, an etching mask film 10, and a resist film 50 formed in this order on the front surface side of a transparent substrate 1 and further comprises a light-shielding film 20 for light-shielding band formation and a resist film 51 formed in this order on the back surface side of the transparent substrate 1.

Figure 7A:
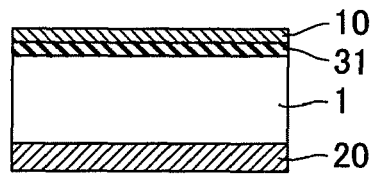
FIGS. 7A to 7I are exemplary sectional views for explaining photomask manufacturing processes according to Example 3 of this invention.
Figure 7B:
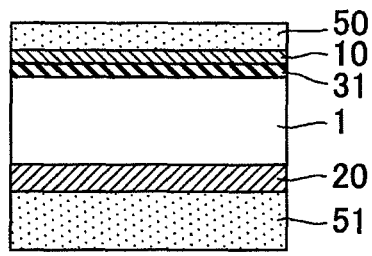
Figure 7C:
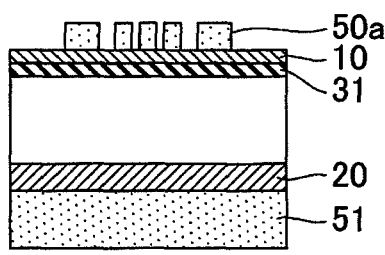
Figure 7D:
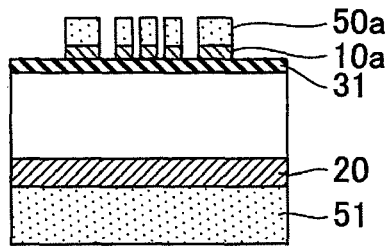
Figure 7E:
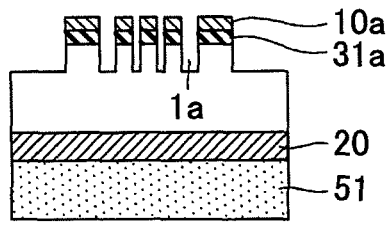
Figure 7F:
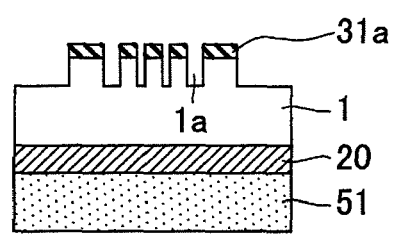
Figure 7G:
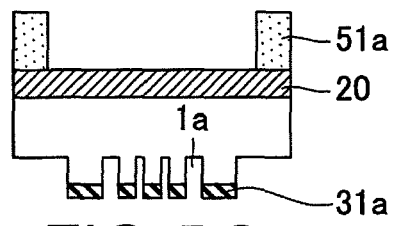
Figure 7H:
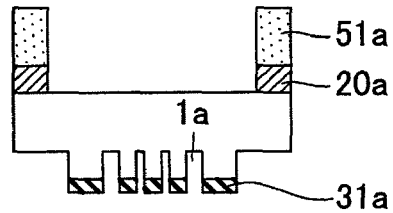
Figure 7I:
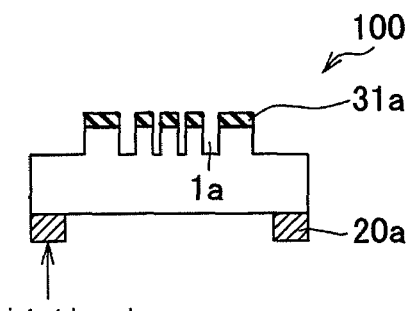

FIG. 7I shows one example of a phase shift mask of this type. As shown in FIG. 7I, this type of phase shift mask has a phase shift part configured by forming a thin halftone phase shift film pattern 31a on a dug-down part 1a of a substrate. In the case of the single-layer phase shift film shown in the second embodiment, a considerably large thickness is required for giving a predetermined phase difference (phase shift amount) to exposure light and simultaneously controlling the transmittance to a predetermined value for the exposure light. In view of this, the photomask blank according to the third embodiment realizes high transmittance for exposure light by reducing the thickness of the single-layer phase shift film and further realizes that a predetermined phase difference is given to the exposure light by providing the dug-down part 1a, having a thickness corresponding to a phase shift amount lessened by reducing the film thickness, at a substrate exposed portion where the halftone phase shift film pattern 31a is not formed.

Figure 4:
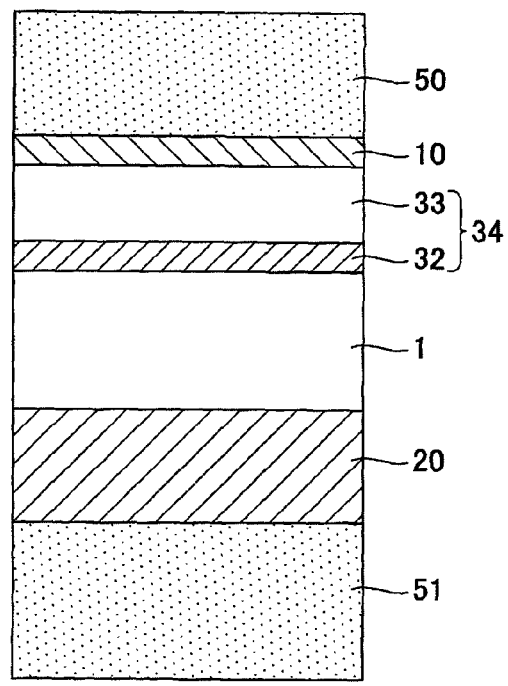
FIG. 4 is an exemplary sectional view showing one example of a photomask blank according to a fourth embodiment of this invention.

FIG. 4 shows one example of a photomask blank according to a fourth embodiment of this invention.

The photomask blank shown in FIG. 4 is used for manufacturing a phase shift mask of the type in which a substrate is not dug down and a high-transmittance phase shift part is formed by providing a high-transmittance halftone phase shift film. In order to obtain high transmittance, the halftone phase shift film comprises two layers, i.e. a phase control layer and a transmittance control layer.

This photomask blank comprises a halftone phase shift film 34 composed of a phase control layer 33 and a transmittance control layer 32, an etching mask film 10, and a resist film 50 formed in this order on the front surface side of a transparent substrate 1 and further comprises a light-shielding film 20 for light-shielding band formation and a resist film 51 formed in this order on the back surface side of the transparent substrate 1.

Figure 8A:
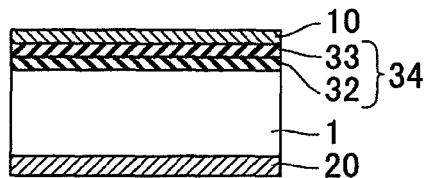
FIGS. 8A to 8I are exemplary sectional views for explaining photomask manufacturing processes according to Example 4 of this invention.
Figure 8B:
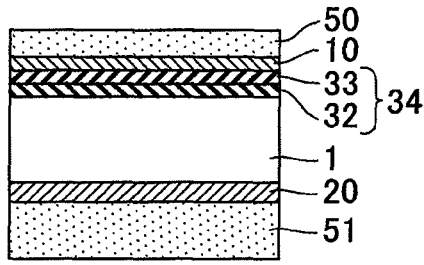
Figure 8C:
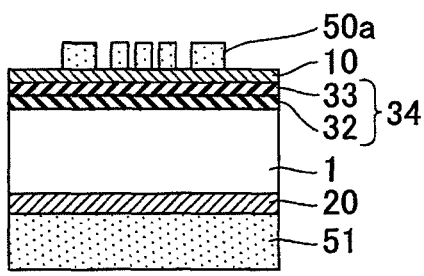
Figure 8D:
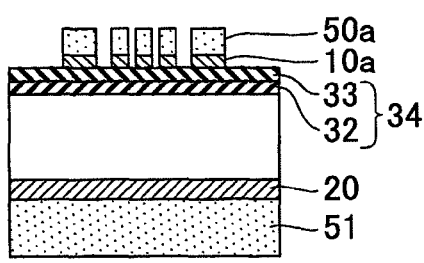
Figure 8E:
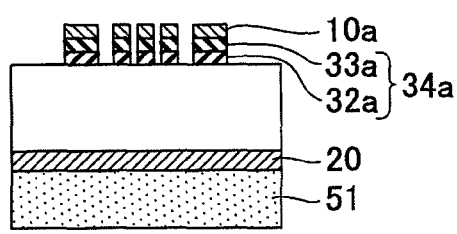
Figure 8F:
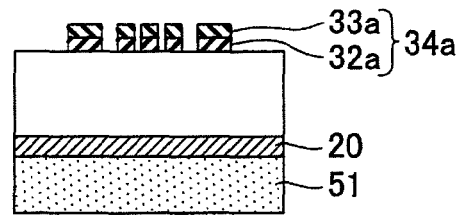
Figure 8G:
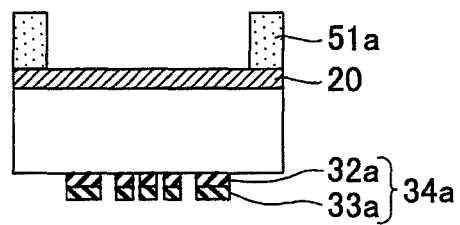
Figure 8H:
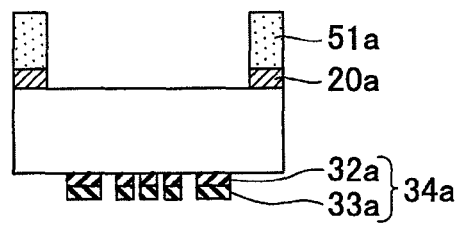
Figure 8I:
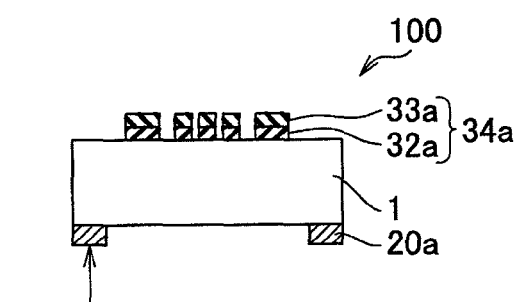

FIG. 8I shows one example of a phase shift mask of this type.

In this invention, as the light-shielding film for light-shielding band formation, a metal film containing a metal can be used. As the metal film containing a metal, there can be cited a film made of a transition metal such as chromium, tantalum, molybdenum, titanium, hafnium, or tungsten, an alloy containing such an element, or a material containing such an element or alloy (e.g. a material containing such an element or alloy and at least one of oxygen, nitrogen, silicon, and carbon). It is possible to use a plural-layer structure with layers of different compositions formed stepwise or a plural-layer structure in which the composition changes continuously.

In this invention, as the etching mask film, use can be made of, for example, chromium alone or a material containing chromium and at least one kind of elements such as oxygen, nitrogen, carbon, and hydrogen (Cr-containing material).

In this invention, it is preferable that the etching mask film can be stripped by dry etching or wet etching without damaging the substrate and other layers.

In this invention, the etching selectivity of the etching mask film to the substrate or other layer (etching rate of the etching mask film/etching rate of the substrate or other layer) is preferably ⅕ or less.

In this invention, the sheet resistance of the substrate formed with the etching mask film is preferably 500 Ω/square or less. This is for providing the photomask blank having a conductivity large enough to prevent charge-up during electron beam writing on the resist film formed in contact with the etching mask film.

In this invention, the phase shift film is preferably made of a material that is substantially dry-etchable with a fluorine-based gas, but not substantially dry-etchable with a chlorine-based gas.

In this invention, as the phase shift film, use can be made of, for example, a silicon-containing film containing silicon. As the silicon-containing film, there can be cited a silicon film, a metal silicide film containing silicon and a metal such as chromium, tantalum, molybdenum, titanium, hafnium, or tungsten, or a film containing at least one of oxygen, nitrogen, and carbon in a silicon film or a metal silicide film.

In this invention, as the phase shift film, use can be made of, for example, a film mainly containing transition metal silicide oxide, transition metal silicide nitride, transition metal silicide oxynitride, transition metal silicide oxycarbide, transition metal silicide nitride carbide, or transition metal silicide oxycarbonitride. As the phase shift film, use can be made of, for example, a halftone film such as a molybdenum-based (MoSiON, MoSiN, MoSiO, or the like) film, a tungsten-based (WSiON, WSiN, WSiO, or the like) film, or a silicon-based (SiN, SiON, or the like) film.

In this invention, as the phase shift film, use can be made of, for example, a halftone film composed of two layers, i.e. a phase adjusting layer for mainly controlling the phase of exposure light and a transmittance adjusting layer for mainly controlling the transmittance of exposure light.

In this invention, as the phase shift film, use can be made of, for example, a halftone film composed of two layers, i.e. a phase adjusting layer for mainly controlling the phase of exposure light and a transmittance adjusting layer for mainly controlling the transmittance of exposure light (see Japanese Unexamined Patent Application Publication (JP-A) No. 2003-322947). Herein, as a material of the transmittance adjusting layer, use can be made of a material containing one kind or two or more kinds selected from metals and silicon, or an oxide, nitride, oxynitride, carbide, or the like thereof. Specifically, there can be cited a material containing one kind or two or more kinds selected from aluminum, titanium, vanadium, chromium, zirconium, niobium, molybdenum, lanthanum, tantalum, tungsten, silicon, and hafnium, or an oxide, nitride, oxynitride, carbide, or the like thereof. As the phase adjusting layer, it is preferable to use a silicon-based thin film made of silicon oxide, silicon nitride, silicon oxynitride, or the like because relatively high transmittance can be easily obtained for exposure light in the ultraviolet region.

(Structure 3) In this invention, the light-shielding film is made of a material being wet-etchable with an etchant to which the light-transmitting substrate has etching resistance.

According to this structure, the formation of the light-shielding band on the back surface of the substrate can be carried out by wet etching at low cost.

(Structure 4) In this invention, the light-shielding film is made of a material mainly containing one of chromium, chromium nitride, chromium oxide, chromium oxynitride, and chromium oxycarbonitride.

According to this structure, the light-shielding film can be made of a material being wet-etchable with an etchant to which the light-transmitting substrate has etching resistance.

In this invention, as the light-shielding film, use can be made of, for example, a material such as chromium alone or a material containing chromium and at least one kind of elements such as oxygen, nitrogen, carbon, and hydrogen (Cr-containing material). As a film structure of the light-shielding film, a single-layer structure or a plural-layer structure made of the above film material/materials can be employed. In the case of the plural-layer structure, it is possible to use a plural-layer structure with layers of different compositions formed stepwise or a film structure in which the composition changes continuously.

A specific example of the plural-layer structure is, for example, a laminated film composed of a light-shielding layer comprising a chromium nitride film (CrN film) and a chromium nitride carbide film (CrCN film) and an antireflection layer comprising a film containing chromium, oxygen, and nitrogen (CrON film). The chromium nitride film is a layer mainly containing chromium nitride (CrN) and has a thickness of, for example 10 nm to 20 nm. The chromium nitride carbide film is a layer mainly containing chromium nitride carbide (CrCN) and has a thickness of, for example, 25 nm to 60 nm. The film containing chromium, oxygen, and nitrogen (CrON film) has a thickness of, for example, 15 nm to 30 nm.

(Structure 5) In this invention, the light-shielding film has a thickness of 60 nm to 100 nm.

According to this structure, the light-shielding band on the back surface of the substrate can have a sufficient optical density.

In this invention, as a film material, other than the above chromium-based material, forming the light-shielding film, use can be made of, for example, tantalum alone or a material containing tantalum and at least one kind of elements such as oxygen, nitrogen, carbon, hydrogen, and boron. As a film structure of the light-shielding film, a single-layer structure or a plural-layer structure can be employed. In the case of the plural-layer structure, it is possible to use a plural-layer structure with layers of different compositions formed stepwise or a film structure in which the composition changes continuously.

A specific example of the plural-layer structure is, for example, a laminated film composed of a light-shielding layer (having a thickness of, for example, 40 nm to 70 nm) made of tantalum nitride (TaN) and an antireflection layer (having a thickness of, for example, 10 nm to 30 nm) made of tantalum oxide (TaO). In this case, the total thickness of the light-shielding film is preferably 50 nm to 100 nm.

Further, in this invention, as a film material forming the light-shielding film, use can be made of, for example, transition metal silicide made of a transition metal and silicon or a material containing transition metal silicide and at least one kind of elements such as oxygen, nitrogen, carbon, and hydrogen. As the transition metal, aluminum, titanium, vanadium, chromium, zirconium, niobium, molybdenum, lanthanum, tantalum, tungsten, silicon, hafnium, or the like is particularly preferable. As a film structure of the light-shielding film, a single-layer structure or a plural-layer structure can be employed. In the case of the plural-layer structure, it is possible to use a plural-layer structure with layers of different compositions formed stepwise or a film structure in which the composition changes continuously.

A specific example of the plural-layer structure is, for example, a laminated film composed of a light-shielding layer (having a thickness of, for example, 30 nm to 50 nm) made of molybdenum silicide (MoSi) and an antireflection layer (having a thickness of, for example, 10 nm to 30 nm) made of molybdenum silicide oxynitride (MoSiON). In this case, the total thickness of the light-shielding film is preferably 40 nm to 80 nm.

Since the etching selectivity of the light-shielding film containing transition metal silicide to the light-transmitting substrate is low, it is necessary to provide, between the light-transmitting substrate and the light-shielding film, an etching stopper film made of a material having etching selectivity to both the light-transmitting substrate and the light-shielding film. As a material of this etching stopper film, use can be made of, for example, chromium alone or a material containing chromium and at least one kind of elements such as oxygen, nitrogen, carbon, and hydrogen (Cr-containing material). Among them, chromium oxycarbonitride (CrOCN) is particularly preferable in terms of stress controllability (low-stress film can be formed). As a film structure of the etching stopper film, a single-layer structure made of the above film material is often employed, but a plural-layer structure can alternatively be employed. In the case of the plural-layer structure, it is possible to use a plural-layer structure with layers of different compositions formed stepwise or a film structure in which the composition changes continuously. The thickness of the etching stopper film is preferably 5 nm to 40 nm. If the thickness is 5 nm to 20 nm, the film stress of the etching stopper film can be more reduced.

(Structure 6) In this invention, the etching mask film is made of a material mainly containing one of chromium, chromium nitride, chromium oxide, chromium oxynitride, and chromium oxycarbonitride.

According to this structure, the etching mask film can be reduced in thickness. Further, it is excellent in processing accuracy. In addition, the etching selectivity of the etching mask film to the upper and lower layers formed in contact therewith is high and, therefore, the etching mask film that becomes unnecessary can be removed without damaging the substrate and other layers.

In this invention, as the etching mask film, use can be made of, for example, chromium alone or a material containing chromium and at least one kind of elements such as oxygen, nitrogen, carbon, and hydrogen (Cr-containing material). As a film structure of the etching mask film, a single-layer structure made of the above film material is often employed, but a plural-layer structure can alternatively be employed. In the case of the plural-layer structure, it is possible to use a plural-layer structure with layers of different compositions formed stepwise or a film structure in which the composition changes continuously.

As the material of the etching mask film, chromium oxycarbonitride (CrOCN) is preferable among them in terms of stress controllability (low-stress film can be formed).

(Structure 7) In this invention, the etching mask film has a thickness of 5 nm to 40 nm.

According to this structure, it is possible to obtain a photomask blank in which the shift amount of CD (Critical Dimension) of a to-be-etched layer with respect to CD of an etching mask layer (the size change amount of the pattern size of a to-be-etched layer with respect to the pattern size of an etching mask layer) is less than 5 nm. If the thickness of the etching mask film is 5 nm to 20 nm, the film stress of the etching mask film can be more reduced.

(Structure 8) In this invention, the phase shift film is made of a material mainly containing one of molybdenum silicide, molybdenum silicide nitride, molybdenum silicide oxide, and molybdenum silicide oxynitride.

According to this structure, there is obtained a halftone phase shift mask having a transmittance of, for example, about 3% to 20% for ArF exposure light.

(Structure 9) In this invention, the phase shift film comprises:

a phase adjusting layer made of a material mainly containing silicon oxide or silicon oxynitride; and a transmittance adjusting layer made of a material mainly containing tantalum or a tantalum-hafnium alloy.

According to this structure, it becomes possible to obtain a high-transmittance halftone phase shift mask, for example, having a transmittance of 20% or more for ArF exposure light without digging down the substrate.

(Structure 10) A photomask of this invention is manufactured using the aforementioned photomask blank of this invention.

According to this structure, there is obtained a photomask having the same operation and effect as those of any of Structures 1 to 9 described above.

(Structure 11) A photomask manufacturing method of this invention using the aforementioned photomask blank of this invention, comprising the steps of:

etching the light-shielding film using a resist film pattern as a mask, thereby forming the light-shielding part in the region other than the transfer pattern region;

dry-etching the etching mask film using a resist film pattern as a mask, thereby forming an etching mask film pattern; and dry-etching the light-transmitting substrate using the etching mask film pattern as a mask, thereby forming the dug-down part that is dug down from the surface of the light-transmitting substrate to the digging depth adapted to produce the predetermined phase difference.

According to this structure, a photomask having the same operation and effect as those of any of Structures 1 to 9 described above is obtained with high manufacturing process efficiency.

In Structure 10 or 11 described above, if the light-shielding film that forms the light-shielding part (light-shielding band) in the region other than the transfer pattern region and the etching mask film are made of the same material (e.g. the same Cr-based material), the following processes are possible.

(1) In this invention, the light-shielding band can be formed by etching the light-shielding film for light-shielding band formation on the back surface side after performing the film formation on the front and back surface sides and further after performing the processing on the front surface side.

When forming the light-shielding band on the back surface side after performing the processing on the front surface side as described above, it is possible to process the light-shielding film by wet etching without protecting the front surface side.

When forming the light-shielding band on the back surface side after performing the processing on the front surface side, if the formation of the light-shielding band is carried out by dry etching, it is necessary to set the photomask blank in a dry etching apparatus with the processed front surface side facing downward. In terms of the mask quality, however, it is not preferable to set the photomask blank in the dry etching apparatus with the processed front surface side facing downward because there is a possibility of generating defects.

(2) In this invention, it is possible that, after performing the film formation on the front and back surface sides, a protective film is formed on the front surface side, then the light-shielding band is formed by wet-etching the light-shielding film for light-shielding band formation on the back surface side, then after stripping the protective film, a resist is formed on the front surface side, thereby performing the processing on the front surface side. The processing on the front surface side is normally carried out by dry etching.

(3) In this invention, before performing the film formation on the front surface side, it is possible to form in advance the light-shielding band by wet-etching the light-shielding film for light-shielding band formation on the back surface side.

(4) In this invention, it is possible that, before performing the film formation on the front surface side, the light-shielding band is formed in advance by wet-etching or dry-etching the light-shielding film for light-shielding band formation on the back surface side, and then the film formation and the processing on the front surface side are carried out. The processing on the front surface side is normally carried out by dry etching.

(Structure 12) Another photomask manufacturing method of this invention using the aforementioned photomask blank of this invention, comprising the steps of:

etching the light-shielding film using a resist film pattern as a mask, thereby forming the light-shielding part in the region other than the transfer pattern region;

dry-etching the etching mask film using a resist film pattern as a mask, thereby forming an etching mask film pattern; and dry-etching the phase shift film using the etching mask film pattern as a mask, thereby forming a phase shift film pattern.

According to this structure, a photomask having the same operation and effect as those of any of Structures 1 to 9 described above is obtained with high manufacturing process efficiency.

In the etching mask film of this invention, a material substantially dry-etchable represents a material having etching properties that enable formation of a transfer pattern with high accuracy when dry etching is performed for forming the transfer pattern, while, a material substantially not dry-etchable represents a material having etching properties capable of serving as an etching mask until a dug-down part with a predetermined digging depth is formed when dry-etching the light-transmitting substrate (until a transfer pattern is formed in the phase shift film when its underlayer is the phase shift film).

In this invention, for dry-etching a chromium-based thin film, it is preferable to use a dry etching gas in the form of a mixed gas containing a chlorine-based gas and an oxygen gas. This is because if a chromium-based thin film made of a material containing chromium and an element such as oxygen or nitrogen is dry-etched using the above dry etching gas, it is possible to increase the dry etching rate and thus to shorten the dry etching time so that an etching mask film pattern with an excellent sectional shape can be formed. As the chlorine-based gas for use in the dry etching, there can be cited, for example, $Cl_2$, $SiCl_4$, HCl, $CCl_4$, $CHCl_3$, or the like.

In this invention, for dry-etching a substrate to form a dug-down part or dry-etching a silicon-containing film containing silicon or a metal silicide-based thin film, use can be made of, for example, a fluorine-based gas such as $SF_6$, $CF_4$, $C_2F_6$, or $CHF_3$, a mixed gas of such a fluorine-based gas and He, $H_2$, $N_2$, Ar, $C_2H_4$, $O_2$ or the like, a chlorine-based gas such as $Cl_2$ or $CH_2Cl_2$, or a mixed gas of such a chlorine-based gas and He, $H_2$, $N_2$, Ar, $C_2H_4$, or the like.

In this invention, the resist is preferably a chemically amplified resist. This is because it is suitable for high-accuracy processing.

This invention is applied to photomask blanks of the generation aiming at a resist film thickness of 200 nm or less and further at a resist film thickness of 150 nm or less.

In this invention, the resist is preferably a resist for electron beam writing. This is because it is suitable for high-accuracy processing.

This invention is applied to a photomask blank for electron beam writing, wherein a resist pattern is formed by electron beam writing.

In this invention, as a substrate, there can be cited a synthetic quartz substrate, a $CaF_2$ substrate, a soda-lime glass substrate, an alkali-free glass substrate, a low thermal expansion glass substrate, an aluminosilicate glass substrate, or the like.

In this invention, photomask blanks include the above various phase shift mask blanks and resist-coated mask blanks.

In this invention, photomasks include the above various phase shift masks. A reticle is included in the photomasks. The phase shift masks include a phase shift mask in which a phase shift part is formed by digging down a substrate.

Hereinbelow, Examples of this invention and Comparative Examples thereof will be shown. In each Example, films such as a light-shielding film, an etching mask film, and a phase shift film were formed by a sputtering method as a film forming method using a DC magnetron sputtering apparatus as a sputtering apparatus. However, for carrying out this invention, there is no particular limitation to such a film forming method and film forming apparatus and use may be made of another type of sputtering apparatus such as an RF magnetron sputtering apparatus.

Example 1

Example 1 relates to a method of manufacturing a photomask blank for use in fabricating a phase shift mask of the type having a phase shift part of the substrate dug-down type and further relates to a method of manufacturing the photomask.

[Manufacture of Photomask Blank]

Referring to FIGS. 5A to 5I, a description will be given of photomask blank and photomask manufacturing methods according to Example 1 of this invention.

First, a substrate made of synthetic quartz was mirror-polished and then cleaned, thereby obtaining a light-transmitting substrate 1 of 6 inches×6 inches×0.25 inches (FIG. 5A).

(Film Formation on Back Surface Side)

Then, a light-shielding film 20 for light-shielding band formation comprising a CrN film, a CrC film, and a CrON film was formed on the back surface side (surface on one side) of a light-transmitting substrate 1 using an in-line type sputtering apparatus in which a plurality of chromium (Cr) targets were disposed in a chamber (FIG. 5A).

Specifically, first, reactive sputtering was carried out in a mixed gas atmosphere of argon (Ar) and nitrogen ($N_2$) (Ar: $N_2$=72:28 [vol %]; pressure: 0.3 [Pa]), thereby forming a CrN film having a thickness of 20 nm. Subsequently, reactive sputtering was carried out in a mixed gas atmosphere of argon (Ar) and methane ($CH_4$) (Ar:$CH_4$=96.5:3.5 [vol %]; pressure: 0.3 [Pa]), thereby forming a CrC film having a thickness of 37 nm on the CrN film. Subsequently, reactive sputtering was carried out in a mixed gas atmosphere of argon (Ar) and nitrogen monoxide (NO) (Ar:NO=87.5:12.5 [vol %]; pressure: 0.3 [Pa]), thereby forming a CrON film having a thickness of 15 nm on the CrC film. The CrN film, the CrC film, and the CrON film described above were continuously formed using the in-line type sputtering apparatus and thus the light-shielding film 20 for light-shielding band formation containing CrN, CrC, and CrON was configured such that these components continuously changed in a thickness direction thereof. The light-shielding film 20 for light-shielding band formation exhibited an OD of 3.5 or more for ArF exposure light (wavelength: 193 nm).

(Film Formation on Front Surface Side)

Then, using a DC magnetron sputtering apparatus, an etching mask film 10 was formed on the front surface side (surface on the other side) of the light-transmitting substrate 1 (FIG. 5A). Specifically, using a chromium target, CrOCN was formed to a thickness of 40 nm under the conditions of introducing gases and flow rates of Ar=18 sccm, $CO_2$=18 sccm, $N_2$=10 sccm and a sputtering power of 1.7 kW. In this event, the film stress of the CrOCN film was adjusted to be as small as possible (preferably, substantially zero).

The sheet resistance was measured for the sample at the stage where the etching mask film 10 was formed, and it was 500 Ω/square or less.

[Manufacture of Photomask]

(Processing on Front Surface Side)

Using a photomask blank thus fabricated as shown in FIG. 5A, a resist film 51 of a positive resist for laser writing (exposure) (THMR-IP3500: manufactured by Tokyo Ohka Kogyo Co., Ltd.) was coated to a thickness of 465 nm on the light-shielding film 20 for light-shielding band formation by a spin-coating method (FIG. 5B). Then, the photomask blank was turned upside down and a resist film 50 of a chemically amplified positive resist for electron beam writing (exposure) (PRL009: manufactured by FUJIFILM Electronic Materials Co., Ltd.) was coated to a thickness of 120 nm on the etching mask film 10 by the spin-coating method (FIG. 5B). The sample at this stage is also sometimes called a photomask blank.

Then, using an electron beam writing apparatus, a desired pattern was written on the resist film 50 and, thereafter, development was carried out using a predetermined developer, thereby forming a resist pattern 50a (FIG. 5C).

Then, using the resist pattern 50a as a mask, the etching mask film 10 was dry-etched, thereby forming an etching mask film pattern 10a (FIG. 5D). In this event, a mixed gas of $Cl_2$ and $O_2$ ($Cl_2$:$O_2$=4:1) was used as a dry etching gas.

Then, the remaining resist pattern 50a was stripped and removed by a chemical solution.

Figure 5E:
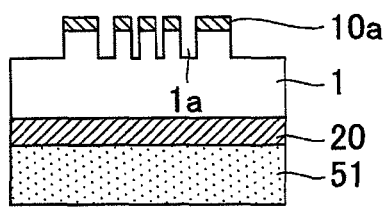

Then, using the etching mask film pattern 10a as a mask, the light-transmitting substrate 1 was dry-etched with a mixed gas of $CHF_3$ and He, thereby obtaining a phase shift pattern (phase shift part) of the substrate dug-down type (FIG. 5E). In this event, the light-transmitting substrate 1 was etched to a depth adapted to obtain a phase difference of 180° for ArF exposure light (193 nm) (specifically, a depth of 170 nm), thereby forming a dug-down part 1a on the light-transmitting substrate 1 to provide the phase shift pattern (phase shift part).

Then, the etching mask film pattern 10a was stripped by dry etching with a mixed gas of $Cl_2$ and $O_2$ ($Cl_2$:$O_2$=4:1) (FIG. 5F).

(Formation of Back-Surface Light-Shielding Band)

Then, the photomask blank was turned upside down and, using a laser writing apparatus, a desired light-shielding band pattern was written on the resist film 51 and then developed, thereby forming a resist pattern 51a (FIG. 5G).

Then, using the resist pattern 51a as a mask, the light-shielding film 20 for light-shielding band formation was wet-etched, thereby forming a light-shielding band 20a on the back surface side of the substrate (FIG. 5H).

Finally, the resist pattern 51a was stripped and then cleaning was carried out, thereby obtaining a photomask 100 (FIG. 5I).

[Evaluation]

The photomask thus obtained was evaluated.

As a result, in the photomask according to Example 1, the shift amount of CD (Critical Dimension) of the phase shift pattern (phase shift part) of the substrate dug-down type with respect to CD of the etching mask film pattern 10a was 4 nm.

The optical density of the light-shielding band 20a was OD=3.5 or more and thus OD≧3 was sufficiently ensured.

Further, with respect to the resolution of the phase shift pattern (phase shift part) of the substrate dug-down type formed on the photomask, it was possible to resolve a phase shift film pattern of 50 nm.

In view of the above, there was obtained the photomask applicable to the hp45 nm generation and further to the hp32 nm to 22 nm generations.

In Example 1, if the subsequent processes are performed without performing the process of FIG. 5F after obtaining the configuration shown in FIG. 5E, there is obtained a photomask similar to the so-called zebra type, wherein the etching mask film pattern 10a made of the chromium-based light-shielding material is provided on the phase shift pattern (phase shift part) of the substrate dug-down type. However, in this case, the optical density of the etching mask film pattern 10a made of the chromium-based light-shielding material is less than 3.

In the photomask manufacturing processes of Example 1, the resist film 50 on the phase shift part forming side and the resist film 51 on the back-surface light-shielding band forming side were both coated at the initial stage. Instead of this, it may be configured such that the resist film 50 is first coated on the phase shift part forming side and the formation of the phase shift part is carried out in advance, and then the resist film 51 is coated on the back-surface light-shielding band forming side and the formation of the back-surface light-shielding band is carried out. This is particularly effective when the distance is long between the place where the process of coating the resist film 50 or 51 is carried out and the place where the process of forming the phase shift part or the back-surface light-shielding band is carried out (when the photomask blank transfer distance is long).

In the photomask manufacturing processes of Example 1, the light-shielding film 20 was wet-etched to form the light-shielding band 20a, but may alternatively be dry-etched using a mixed gas of $Cl_2$ and $O_2$ ($Cl_2$:$O_2$=4:1).

In the photomask manufacturing processes of Example 1, the resist films 50 and 51 were coated on both surfaces, then the phase shift pattern was first formed, and then the light-shielding band 20a was formed. However, the light-shielding band 20a may first be formed. In this case, it is necessary to cover the etching mask film 10 with a protective film or the like for preventing the etching mask film 10 from being etched during etching of the light-shielding film 20. As this protective film, a resin film is preferable and, for example, polyethylene terephthalate, polyimide, or the like can be cited.

Example 2

Example 2 relates to a method of manufacturing a photomask blank for use in fabricating a phase shift mask of the type in which a substrate is not basically dug down and a phase shift part is formed by a halftone phase shift film, and further relates to a method of manufacturing the photomask.

[Manufacture of Photomask Blank]

Referring to FIGS. 6A to 6I, a description will be given of photomask blank and photomask manufacturing methods according to Example 2 of this invention.

First, a substrate made of synthetic quartz was mirror-polished and then cleaned, thereby obtaining a light-transmitting substrate 1 of 6 inches×6 inches×0.25 inches (FIG. 6A).

(Film Formation on Back Surface Side)

Then, a light-shielding film 20 for light-shielding band formation comprising a CrN film, a CrC film, and a CrON film was formed on the back surface side (surface on one side) of a light-transmitting substrate 1 using an in-line type sputtering apparatus in which a plurality of chromium (Cr) targets were disposed in a chamber (FIG. 6A).

Specifically, first, reactive sputtering was carried out in a mixed gas atmosphere of argon (Ar) and nitrogen ($N_2$) (Ar:$N_2$=72:28 [vol %]; pressure: 0.3 [Pa]), thereby forming a CrN film having a thickness of 20 nm. Subsequently, reactive sputtering was carried out in a mixed gas atmosphere of argon (Ar) and methane ($CH_4$) (Ar:$CH_4$=96.5:3.5 [vol %]; pressure: 0.3 [Pa]), thereby forming a CrC film having a thickness of 37 nm on the CrN film. Subsequently, reactive sputtering was carried out in a mixed gas atmosphere of argon (Ar) and nitrogen monoxide (NO) (Ar:NO=87.5:12.5 [vol %]; pressure: 0.3 [Pa]), thereby forming a CrON film having a thickness of 15 nm on the CrC film. The CrN film, the CrC film, and the CrON film described above were continuously formed using the in-line type sputtering apparatus and thus the light-shielding film 20 for light-shielding band formation containing CrN, CrC, and CrON was configured such that these components continuously changed in a thickness direction thereof. The light-shielding film 20 for light-shielding band formation exhibited an OD of 4 or more for ArF exposure light (wavelength: 193 nm).

(Film Formation on Front Surface Side)

Then, using a mixed target of molybdenum (Mo) and silicon (Si) (Mo:Si=1:9 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based light-semitransmitting phase shift film 30 having a thickness of 69 nm on the front surface side (surface on the other side) of the light-transmitting substrate 1 (FIG. 6A). In this event, the thickness of the phase shift film 30 was adjusted so as to obtain a phase difference of 180°. The transmittance of the phase shift film 30 for ArF exposure light (wavelength: 193 nm) was 6%.

Then, using a DC magnetron sputtering apparatus, an etching mask film 10 was formed on the phase shift film 30 (FIG. 6A). Specifically, using a chromium target, CrOCN was formed to a thickness of 30 nm under the conditions of introducing gases and flow rates of Ar=18 sccm, $CO_2$=18 sccm, $N_2$=10 sccm and a sputtering power of 1.7 kW. In this event, the film stress of the CrOCN film was adjusted to be as small as possible (preferably, substantially zero).

The sheet resistance was measured for the sample at the stage where the etching mask film 10 was formed, and it was 500 Ω/square or less.

[Manufacture of Photomask]

(Processing on Front Surface Side)

Using a photomask blank thus fabricated as shown in FIG. 6A, a resist film 51 of a positive resist for laser writing (exposure) (THMR-IP3500: manufactured by Tokyo Ohka Kogyo Co., Ltd.) was coated to a thickness of 465 nm on the light-shielding film 20 for light-shielding band formation by a spin-coating method (FIG. 6B). Then, the photomask blank was turned upside down and a resist film 50 of a chemically amplified positive resist for electron beam writing (exposure) (PRL009: manufactured by FUJIFILM Electronic Materials Co., Ltd.) was coated to a thickness of 120 nm on the etching mask film 10 by the spin-coating method (FIG. 6B). The sample at this stage is also sometimes called a photomask blank.

Then, using an electron beam writing apparatus, a desired pattern was written on the resist film 50 and, thereafter, development was carried out using a predetermined developer, thereby forming a resist pattern 50a (FIG. 6C).

Then, using the resist pattern 50a as a mask, the etching mask film 10 was dry-etched, thereby forming an etching mask film pattern 10a (FIG. 6D). In this event, a mixed gas of $Cl_2$ and $O_2$ ($Cl_2:O_2=4:1$) was used as a dry etching gas.

Then, the remaining resist pattern 50a was stripped and removed by a chemical solution.

Figure 6E:
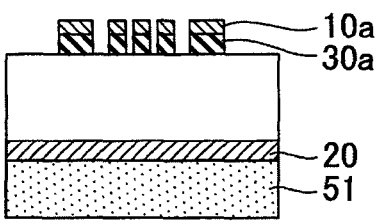

Then, using the etching mask film pattern 10a as a mask, the phase shift film 30 was dry-etched with a mixed gas of $SF_6$ and He, thereby forming a phase shift film pattern 30a (FIG. 6E).

Then, the etching mask film pattern 10a was stripped by dry etching with a mixed gas of $Cl_2$ and $O_2$ ($Cl_2:O_2=4:1$) (FIG. 6F).

(Formation of Back-Surface Light-Shielding Band)

Then, the photomask blank was turned upside down and, using a laser writing apparatus, a desired light-shielding band pattern was written on the resist film 51 and then developed, thereby forming a resist pattern 51a (FIG. 6G).

Then, using the resist pattern 51a as a mask, the light-shielding film 20 for light-shielding band formation was wet-etched, thereby forming a light-shielding band 20a on the back surface side of the substrate (FIG. 6H).

Finally, the resist pattern 51a was stripped and then cleaning was carried out, thereby obtaining a photomask 100 (FIG. 6I).

[Evaluation]

The photomask thus obtained was evaluated.

As a result, in the photomask according to Example 2, the shift amount of CD (Critical Dimension) of the MoSiN-based halftone phase shift film pattern (phase shift part) 30a with respect to CD of the etching mask film pattern 10a was 3 nm.

The optical density of the light-shielding band 20a was OD=3.5 or more and thus OD≧3 was sufficiently ensured.

Further, with respect to the resolution of the transfer pattern formed on the photomask, it was possible to resolve the MoSiN-based halftone phase shift film pattern 30a of 50 nm.

In view of the above, there was obtained the photomask applicable to the hp45 nm generation and further to the hp32 nm to 22 nm generations.

In Example 2, in addition to the light-shielding band 20a on the back surface side, it is also possible to form a light-shielding band on the front surface side using the phase shift film 30. In this case, since the OD of the phase shift film 30 on the front surface side can also be used, it is possible to reduce the thickness of the light-shielding band 20a on the back surface side.

In the photomask manufacturing processes of Example 2, the resist film 50 on the phase shift part forming side and the resist film 51 on the back-surface light-shielding band forming side were both coated at the initial stage. Instead of this, it may be configured such that the resist film 50 is first coated on the phase shift part forming side and the formation of the phase shift part is carried out in advance, and then the resist film 51 is coated on the back-surface light-shielding band forming side and the formation of the back-surface light-shielding band is carried out. This is particularly effective when the distance is long between the place where the process of coating the resist film 50 or 51 is carried out and the place where the process of forming the phase shift part or the back-surface light-shielding band is carried out (when the photomask blank transfer distance is long).

In the photomask manufacturing processes of Example 2, the light-shielding film 20 was wet-etched to form the light-shielding band 20a, but may alternatively be dry-etched using a mixed gas of $Cl_2$ and $O_2$ ($Cl_2:O_2=4:1$).

In the photomask manufacturing processes of Example 2, the resist films 50 and 51 were coated on both surfaces, then the phase shift pattern was first formed, and then the light-shielding band 20a was formed. However, the light-shielding band 20a may first be formed. In this case, it is necessary to cover the etching mask film 10 with a protective film or the like for preventing the etching mask film 10 from being etched during etching of the light-shielding film 20. As this protective film, a resin film is preferable and, for example, polyethylene terephthalate, polyimide, or the like can be cited.

Example 3

Example 3 relates to a method of manufacturing a photomask blank for use in fabricating a phase shift mask of the type in which a high-transmittance phase shift part is formed by providing a halftone phase shift film and further by digging down a substrate, and further relates to a method of manufacturing the photomask.

[Manufacture of Photomask Blank]

Referring to FIGS. 7A to 7I, a description will be given of photomask blank and photomask manufacturing methods according to Example 3 of this invention.

First, a substrate made of synthetic quartz was mirror-polished and then cleaned, thereby obtaining a light-transmitting substrate 1 of 6 inches×6 inches×0.25 inches (FIG. 7A).

(Film Formation on Back Surface Side)

Then, a light-shielding film 20 for light-shielding band formation comprising a CrN film, a CrC film, and a CrON film was formed on the back surface side (surface on one side) of a light-transmitting substrate 1 using an in-line type sputtering apparatus in which a plurality of chromium (Cr) targets were disposed in a chamber (FIG. 7A).

Specifically, first, reactive sputtering was carried out in a mixed gas atmosphere of argon (Ar) and nitrogen ($N_2$) (Ar:$N_2$=72:28 [vol %]; pressure: 0.3 [Pa]), thereby forming a CrN film having a thickness of 20 nm. Subsequently, reactive sputtering was carried out in a mixed gas atmosphere of argon (Ar) and methane ($CH_4$) (Ar:$CH_4$=96.5:3.5 [vol %]; pressure: 0.3 [Pa]), thereby forming a CrC film having a thickness of 37 nm on the CrN film. Subsequently, reactive sputtering was carried out in a mixed gas atmosphere of argon (Ar) and nitrogen monoxide (NO) (Ar:NO=87.5:12.5 [vol %]; pressure: 0.3 [Pa]), thereby forming a CrON film having a thickness of 15 nm on the CrC film. The CrN film, the CrC film, and the CrON film described above were continuously formed using the in-line type sputtering apparatus and thus the light-shielding film 20 for light-shielding band formation containing CrN, CrC, and CrON was configured such that these components continuously changed in a thickness direction thereof. The light-shielding film 20 for light-shielding band formation exhibited an OD of 3.5 or more for ArF exposure light (wavelength: 193 nm).

(Film Formation on Front Surface Side)

Then, using a mixed target of molybdenum (Mo) and silicon (Si) (Mo:Si=1:9 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based light-semitransmitting phase shift film 31 having a thickness of 38 nm on the front surface side (surface on the other side) of the light-transmitting substrate 1 (FIG. 7A). In this event, the thickness of the phase shift film 31 was adjusted so that the transmittance of the phase shift film 31 for ArF exposure light (wavelength: 193 nm) became 20%.

Then, using a single-wafer sputtering apparatus, an etching mask film 10 was formed on the phase shift film 31 (FIG. 7A). Specifically, using a chromium target, CrOCN was formed to a thickness of 40 nm under the conditions of introducing gases and flow rates of Ar=18 sccm, $CO_2$=18 sccm, $N_2$=10 sccm and a sputtering power of 1.7 kW. In this event, the film stress of the CrOCN film was adjusted to be as small as possible (preferably, substantially zero).

The sheet resistance was measured for the sample at the stage where the etching mask film 10 was formed, and it was 500 Ω/square or less.

[Manufacture of Photomask]
(Processing on Front Surface Side)

Using a photomask blank thus fabricated as shown in FIG. 7A, a resist film 51 of a positive resist for laser writing (exposure) (THMR-IP3500: manufactured by Tokyo Ohka Kogyo Co., Ltd.) was coated to a thickness of 465 nm on the light-shielding film 20 for light-shielding band formation by a spin-coating method (FIG. 7B). Then, the photomask blank was turned upside down and a resist film 50 of a chemically amplified positive resist for electron beam writing (exposure) (PRL009: manufactured by FUJIFILM Electronic Materials Co., Ltd.) was coated to a thickness of 150 nm on the etching mask film 10 by the spin-coating method (FIG. 7B). The sample at this stage is also sometimes called a photomask blank.

Then, using an electron beam writing apparatus, a desired pattern was written on the resist film 50 and, thereafter, development was carried out using a predetermined developer, thereby forming a resist pattern 50a (FIG. 7C).

Then, using the resist pattern 50a as a mask, the etching mask film 10 was dry-etched, thereby forming an etching mask film pattern 10a (FIG. 7D). In this event, a mixed gas of $Cl_2$ and $O_2$ ($Cl_2$:$O_2$=4:1) was used as a dry etching gas.

Then, the remaining resist pattern 50a was stripped and removed by a chemical solution.

Then, using the etching mask film pattern 10a as a mask, the phase shift film 31 and the light-transmitting substrate 1 were dry-etched in order using a mixed gas of $CHF_3$ and He, thereby forming a phase shift film pattern 31a and a dug-down part 1a on the light-transmitting substrate 1 to obtain a phase shift pattern (phase shift part) (FIG. 7E). In this event, the light-transmitting substrate 1 was etched to a depth adapted to obtain a phase difference of 180° as the sum of phase differences produced by the phase shift film pattern 31a and the dug-down part 1a of the light-transmitting substrate 1 (specifically, a depth of 76 nm).

Then, the etching mask film pattern 10a was stripped by dry etching with a mixed gas of $Cl_2$ and $O_2$ ($Cl_2$:$O_2$=4:1) (FIG. 7F).

(Formation of Back-Surface Light-Shielding Band)

Then, the photomask blank was turned upside down and, using a laser writing apparatus, a desired light-shielding band pattern was written on the resist film 51 and then developed, thereby forming a resist pattern 51a (FIG. 7G).

Then, using the resist pattern 51a as a mask, the light-shielding film 20 for light-shielding band formation was wet-etched, thereby forming a light-shielding band 20a on the back surface side of the substrate (FIG. 7H).

Finally, the resist pattern 51a was stripped and then cleaning was carried out, thereby obtaining a photomask 100 (FIG. 7I).

[Evaluation]

The photomask thus obtained was evaluated.

As a result, in the photomask according to Example 3, the shift amount of CD (Critical Dimension) of the phase shift film pattern 31a and the phase shift pattern of the substrate dug-down type with respect to CD of the etching mask film pattern 10a was 4 nm.

The optical density of the light-shielding band 20a was OD=3.5 or more and thus OD≧3 was sufficiently ensured.

Further, with respect to the resolution of the phase shift pattern of the substrate dug-down type formed on the photomask, it was possible to resolve a phase shift film pattern of 50 nm.

In view of the above, there was obtained the photomask applicable to the hp45 nm generation and further to the hp32 nm to 22 nm generations.

In the photomask manufacturing processes of Example 3, the light-shielding film 20 was wet-etched to form the light-shielding band 20a, but may alternatively be dry-etched using a mixed gas of $Cl_2$ and $O_2$ ($Cl_2$:$O_2$=4:1).

In the photomask manufacturing processes of Example 3, the resist film 50 on the phase shift part forming side and the resist film 51 on the back-surface light-shielding band forming side were both coated at the initial stage. Instead of this, it may be configured such that the resist film 50 is first coated on the phase shift part forming side and the formation of the phase shift part is carried out in advance, and then the resist film 51 is coated on the back-surface light-shielding band forming side and the formation of the back-surface light-shielding band is carried out. This is particularly effective when the distance is long between the place where the process of coating the resist film 50 or 51 is carried out and the place where the process of forming the phase shift part or the back-surface light-shielding band is carried out (when the photomask blank transfer distance is long).

In the photomask manufacturing processes of Example 3, the resist films 50 and 51 were coated on both surfaces, then the phase shift pattern was first formed, and then the light-shielding band 20a was formed. However, the light-shielding band 20a may first be formed. In this case, it is necessary to cover the etching mask film 10 with a protective film or the like for preventing the etching mask film 10 from being etched during etching of the light-shielding film 20. As this protective film, a resin film is preferable and, for example, polyethylene terephthalate, polyimide, or the like can be cited.

Example 4

Example 4 relates to a method of manufacturing a photomask blank for use in fabricating a phase shift mask of the type in which a substrate is not dug down and a high-transmittance phase shift part is formed by providing a high-transmittance halftone phase shift film, and further relates to a method of manufacturing the photomask.

[Manufacture of Photomask Blank]

Referring to FIGS. 8A to 8I, a description will be given of photomask blank and photomask manufacturing methods according to Example 4 of this invention.

First, a substrate made of synthetic quartz was mirror-polished and then cleaned, thereby obtaining a light-transmitting substrate 1 of 6 inches×6 inches×0.25 inches (FIG. 8A).

(Film Formation on Back Surface Side)

Then, a light-shielding film 20 for light-shielding band formation comprising a CrN film, a CrC film, and a CrON film was formed on the back surface side (surface on one side) of a light-transmitting substrate 1 using an in-line type sputtering apparatus in which a plurality of chromium (Cr) targets were disposed in a chamber (FIG. 8A).

Specifically, first, reactive sputtering was carried out in a mixed gas atmosphere of argon (Ar) and nitrogen ($N_2$) (Ar:$N_2$=72:28 [vol%]; pressure: 0.3 [Pa]), thereby forming a CrN film having a thickness of 20 nm. Subsequently, reactive sputtering was carried out in a mixed gas atmosphere of argon (Ar) and methane ($CH_4$) (Ar:$CH_4$=96.5:3.5 [vol%]; pressure: 0.3 [Pa]), thereby forming a CrC film having a thickness of 37 nm on the CrN film. Subsequently, reactive sputtering was carried out in a mixed gas atmosphere of argon (Ar) and nitrogen monoxide (NO) (Ar:NO=87.5:12.5 [vol %]; pressure: 0.3 [Pa]), thereby forming a CrON film having a thickness of 15 nm on the CrC film. The CrN film, the CrC film, and the CrON film described above were continuously formed using the in-line type sputtering apparatus and thus the light-shielding film 20 for light-shielding band formation containing CrN, CrC, and CrON was configured such that these components continuously changed in a thickness direction thereof. The light-shielding film 20 for light-shielding band formation exhibited an OD of 3.5 or more for ArF exposure light (wavelength: 193 nm).

(Film Formation on Front Surface Side)

Then, using a DC magnetron sputtering apparatus, a high-transmittance halftone phase shift film 34 in the form of a laminated film comprising a transmittance adjusting layer 32 made of TaHf and a phase adjusting layer 33 made of SiON was formed on the front surface side (surface on the other side) of the light-transmitting substrate 1. Specifically, using a target of Ta:Hf=80:20 (at % ratio) and using Ar as a sputtering gas, the layer 32 made of tantalum and hafnium (TaHf layer:at % ratio of Ta and Hf in the layer was about 80:20) was formed to a thickness of 12 nm and, then, using a Si target, reactive sputtering was carried out in a mixed gas atmosphere of argon (Ar), nitrogen ($N_2$), and oxygen ($O_2$) (Ar:$N_2$:$O_2$=20:57:23 [vol %]), thereby forming the SiON layer 33 having a thickness of 112 nm (FIG. 8A). In this event, the thicknesses of the respective layers were adjusted to cause the phase shift film 34 to produce a phase difference of 180° for ArF exposure light (wavelength: 193 nm). The transmittance of the phase shift film 34 for ArF exposure light (wavelength: 193 nm) was 20%, i.e. a high transmittance.

Then, using a DC magnetron sputtering apparatus, an etching mask film 10 was formed on the phase shift film 34 (FIG. 8A). Specifically, using a chromium target, CrOCN was formed to a thickness of 25 nm under the conditions of introducing gases and flow rates of Ar=18 sccm, $CO_2$=18 sccm, $N_2$=10 sccm and a sputtering power of 1.7 kW. In this event, the film stress of the CrOCN film was adjusted to be as small as possible (preferably, substantially zero).

The sheet resistance was measured for the sample at the stage where the etching mask film 10 was formed, and it was 500 Ω/square or less.

[Manufacture of Photomask]

(Processing on Front Surface Side)

Using a photomask blank thus fabricated as shown in FIG. 8A, a resist film 51 of a positive resist for laser writing (exposure) (THMR-IP3500: manufactured by Tokyo Ohka Kogyo Co., Ltd.) was coated to a thickness of 465 nm on the light-shielding film 20 for light-shielding band formation by a spin-coating method (FIG. 8B). Then, the photomask blank was turned upside down and a resist film 50 of a chemically amplified positive resist for electron beam writing (exposure) (PRL009: manufactured by FUJIFILM Electronic Materials Co., Ltd.) was coated to a thickness of 150 nm on the etching mask film 10 by the spin-coating method (FIG. 8B). The sample at this stage is also sometimes called a photomask blank.

Then, using an electron beam writing apparatus, a desired pattern was written on the resist film 50 and, thereafter, development was carried out using a predetermined developer, thereby forming a resist pattern 50a (FIG. 8C).

Then, using the resist pattern 50a as a mask, the etching mask film 10 was dry-etched, thereby forming an etching mask film pattern 10a (FIG. 8D). In this event, a mixed gas of $Cl_2$ and $O_2$ ($Cl_2$:$O_2$=4:1) was used as a dry etching gas.

Then, the remaining resist pattern 50a was stripped and removed by a chemical solution.

Then, using the etching mask film pattern 10a as a mask, the phase adjusting layer 33 made of SiON was dry-etched with a mixed gas of $SF_6$ and He, thereby forming a phase adjusting layer pattern 33a (FIG. 8E). Further, using the etching mask film pattern 10a and so on as a mask, the transmittance adjusting layer 32 made of TaHf was dry-etched with a $Cl_2$ gas, thereby forming a transmittance adjusting layer pattern 32a (FIG. 8E). Consequently, there was formed a phase shift film pattern 34a comprising the phase adjusting layer pattern 33a and the transmittance adjusting layer pattern 32a (FIG. 8E).

Then, the etching mask film pattern 10a was stripped by dry etching with a mixed gas of $Cl_2$ and $O_2$ ($Cl_2$:$O_2$=4:1) (FIG. 8F).

(Formation of Back-Surface Light-Shielding Band)

Then, the photomask blank was turned upside down and, using a laser writing apparatus, a desired light-shielding band pattern was written on the resist film 51 and then developed, thereby forming a resist pattern 51a (FIG. 8G).

Then, using the resist pattern 51a as a mask, the light-shielding film 20 for light-shielding band formation was wet-etched, thereby forming a light-shielding band 20a on the back surface side of the substrate (FIG. 8H).

Finally, the resist pattern 51a was stripped and then cleaning was carried out, thereby obtaining a photomask 100 (FIG. 8I).

[Evaluation]

The photomask thus obtained was evaluated.

As a result, in the photomask according to Example 4, the shift amount of CD (Critical Dimension) of the high-transmittance halftone phase shift film pattern (phase shift part) 34a with respect to CD of the etching mask film pattern 10a was 4 nm.

The optical density of the light-shielding band 20a was OD=3.5 or more and thus OD≧3 was sufficiently ensured.

Further, with respect to the resolution of the transfer pattern formed on the photomask, it was possible to resolve the high-transmittance halftone phase shift film pattern 34a of 50 nm.

In view of the above, there was obtained the photomask applicable to the hp45 nm generation and further to the hp32 nm to 22 nm generations.

In Example 4, in addition to the light-shielding band 20a on the back surface side, it is also possible to form a light-shielding band on the front surface side using the phase shift film 34. In this case, since the OD of the phase shift film 34 on the front surface side can also be used, it is possible to reduce the thickness of the light-shielding band 20a on the back surface side.

In the photomask manufacturing processes of Example 4, the light-shielding film 20 was wet-etched to form the light-shielding band 20a, but may alternatively be dry-etched using a mixed gas of $Cl_2$ and $O_2$ ($Cl_2:O_2=4:1$).

In the photomask manufacturing processes of Example 4, the resist film 50 on the phase shift part forming side and the resist film 51 on the back-surface light-shielding band forming side were both coated at the initial stage. Instead of this, it may be configured such that the resist film 50 is first coated on the phase shift part forming side and the formation of the phase shift part is carried out in advance, and then the resist film 51 is coated on the back-surface light-shielding band forming side and the formation of the back-surface light-shielding band is carried out. This is particularly effective when the distance is long between the place where the process of coating the resist film 50 or 51 is carried out and the place where the process of forming the phase shift part or the back-surface light-shielding band is carried out (when the photomask blank transfer distance is long).

In the photomask manufacturing processes of Example 4, the resist films 50 and 51 were coated on both surfaces, then the phase shift pattern was first formed, and then the light-shielding band 20a was formed. However, the light-shielding band 20a may first be formed. In this case, it is necessary to cover the etching mask film 10 with a protective film or the like for preventing the etching mask film 10 from being etched during etching of the light-shielding film 20. As this protective film, a resin film is preferable and, for example, polyethylene terephthalate, polyimide, or the like can be cited.

The photomask blank used in each of Examples 1 to 4 is a photomask blank having, on the substrate front surface side (one surface side), a film for forming an etching mask pattern and having, on the substrate back surface side (other surface side), a film for forming a light-shielding band.

Further, the photomask blank used in each of Examples 1 to 4 is a photomask blank in which a light-shielding film for light-shielding band formation and an etching mask film are made of the same Cr-based material, the thickness of the etching mask film is 40 nm or less, and the thickness of the light-shielding film for light-shielding band formation is 60 nm or more.

Example 5

Example 5 relates to a method of manufacturing a photomask blank for use in fabricating a phase shift mask of the type having a phase shift part of the substrate dug-down type and further relates to a method of manufacturing the photomask, wherein a light-shielding film is made of a material mainly containing tantalum (Ta).

[Manufacture of Photomask Blank]

Referring to FIGS. 5A to 5I (also used for describing Example 1), a description will be given of photomask blank and photomask manufacturing methods according to Example 5 of this invention.

A light-transmitting substrate 1 was obtained in the same manner as in Example 1 (FIG. 5A).

(Film Formation on Back Surface Side)

Using a DC magnetron sputtering apparatus, a light-shielding film 20 having a two-layer structure in which a tantalum nitride (TaN) layer and a tantalum oxide (TaO) layer were laminated was formed on the back surface side (surface on one side) of the light-transmitting substrate 1 (FIG. 5A).

Specifically, using a Ta target, a layer of tantalum nitride (TaN) was formed to a thickness of 45 nm under the conditions of introducing gases and flow rates of Xe=11 sccm, $N_2$=15 sccm, and a sputtering power of 1.5 kW. Then, using the same Ta target, a layer of tantalum oxide (TaO) was formed to a thickness of 10 nm under the conditions of introducing gases and flow rates of Ar=58 sccm, $O_2$=32.5 sccm, and a sputtering power of 0.7 kW. The light-shielding film 20 for light-shielding band formation exhibited an OD of 3 or more for ArF exposure light (wavelength: 193 nm).

(Film Formation on Front Surface Side)

An etching mask film 10 was formed under the same conditions as in Example 1 (FIG. 5A).

[Manufacture of Photomask]

(Processing on Front Surface Side)

Formation of a phase shift part using the etching mask film 10 on the front surface side of the substrate was carried out in the same manner as in Example 1 (FIGS. 5C to 5F).

(Formation of Back-Surface Light-Shielding Band)

Then, the photomask blank was turned upside down and, using a laser writing apparatus, a desired light-shielding band pattern was written on a resist film 51 and then developed, thereby forming a resist pattern 51a (FIG. 5G).

Then, using the resist pattern 51a as a mask, the TaO layer of the light-shielding film 20 was dry-etched with a mixed gas of $CHF_3$ and He, then the TaN layer of the light-shielding film 20 was dry-etched with a $Cl_2$ gas, thereby forming a light-shielding band 20a on the back surface side of the substrate (FIG. 5H).

Finally, the resist pattern 51a was stripped and then cleaning was carried out, thereby obtaining a photomask 100 (FIG. 5I).

[Evaluation]

The photomask thus obtained was evaluated.

As a result, in the photomask according to Example 5, the shift amount of CD (Critical Dimension) of the phase shift pattern (phase shift part) of the substrate dug-down type with respect to CD of the etching mask film pattern 10a was 4 nm.

The optical density of the light-shielding band 20a was OD=3 or more and thus OD≧3 was sufficiently ensured.

Further, with respect to the resolution of the phase shift pattern (phase shift part) of the substrate dug-down type formed on the photomask, it was possible to resolve a phase shift film pattern of 50 nm.

In view of the above, there was obtained the photomask applicable to the hp45 nm generation and further to the hp32 nm to 22 nm generations.

In Example 5, the description has been given about the photomask having the phase shift part of the substrate dug-down type and the photomask blank for fabricating such a photomask, but it is also applicable to the case where a light-shielding film and a light-shielding band are made of a material mainly containing tantalum in each of the photomasks having the phase shift parts described in Examples 2 to 4 and each of the photomask blanks for fabricating such photomasks.

In the photomask manufacturing processes of Example 5, the resist film 50 on the phase shift part forming side and the resist film 51 on the back-surface light-shielding band forming side were both coated at the initial stage. Instead of this, it may be configured such that the resist film 50 is first coated on the phase shift part forming side and the formation of the phase shift part is carried out in advance, and then the resist film 51 is coated on the back-surface light-shielding band forming side and the formation of the back-surface light-shielding band is carried out. This is particularly effective when the distance is long between the place where the process of coating the resist film 50 or 51 is carried out and the place where the process of forming the phase shift part or the back-surface light-shielding band is carried out (when the photomask blank transfer distance is long).

Example 6

Example 6 relates to a method of manufacturing a photomask blank for use in fabricating a phase shift mask of the type having a phase shift part of the substrate dug-down type and further relates to a method of manufacturing the photomask, wherein a light-shielding film is made of a material mainly containing molybdenum silicide (MoSi).
[Manufacture of Photomask Blank]

Referring to FIGS. 9A to 9J, a description will be given of photomask blank and photomask manufacturing methods according to Example 6 of this invention.

Figure 9A:
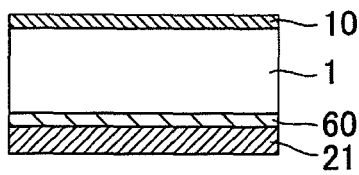
FIGS. 9A to 9J are exemplary sectional views for explaining photomask manufacturing processes according to Example 6 of this invention.
Figure 9B:
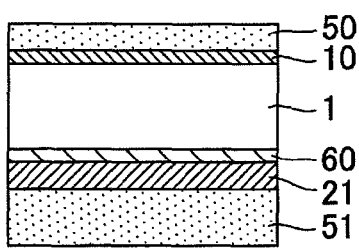
Figure 9F:
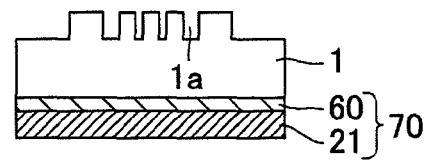

A light-transmitting substrate 1 was obtained in the same manner as in Example 1 (FIG. 9A).
(Film Formation on Back Surface Side)

Using a DC magnetron sputtering apparatus, a CrN film was formed on the back surface side (surface on one side) of the light-transmitting substrate 1 as an etching stopper film 60 serving also as a back-surface antireflection layer (FIG. 9A). Specifically, using a chromium target, the etching stopper film 60 was formed to a thickness of 20 nm by introducing Ar and $N_2$ at a sputtering gas pressure of 0.1 Pa (gas flow rate ratio Ar:$N_2$=4:1) and setting the sputtering power to 1.3 kW.

Then, using a DC magnetron sputtering apparatus, a light-shielding film 21 in the form of a laminated film comprising a molybdenum silicide (MoSi) layer and a molybdenum silicide oxynitride (MoSiON) layer was formed on the etching stopper film 60 (FIG. 9A).

Specifically, first, using a target of Mo:Si=21:79 (at % ratio), the MoSi layer was formed to a thickness of 25 nm by introducing Ar at a sputtering gas pressure of 0.1 Pa and setting the sputtering powerto 2.0 kW. Then, using a target of Mo:Si=4:96 (at % ratio), the MoSiON layer was formed to a thickness of 10 nm by introducing Ar, $O_2$, $N_2$, and He at a sputtering gas pressure of 0.2 Pa (gas flow rate ratio Ar:$O_2$:$N_2$:He=5:4:49:42) and setting the sputtering power to 3.0 kW.

In Example 6, the etching stopper film 60 and the light-shielding film 21 cooperatively form a light-shielding band. A laminated film composed of the etching stopper film 60 and the light-shielding film 21 exhibited an OD of 3 or more for ArF exposure light (wavelength: 193 nm).
(Film Formation on Front Surface Side)

An etching mask film 10 was formed under the same conditions as in Example 1 (FIG. 9A).
[Manufacture of Photomask]
(Processing on Front Surface Side)

Formation of a phase shift part using the etching mask film 10 on the front surface side of the substrate was carried out in the same manner as in Example 1 (FIGS. 9C to 9F).
(Formation of Back-Surface Light-Shielding Band)

Figure 9G:
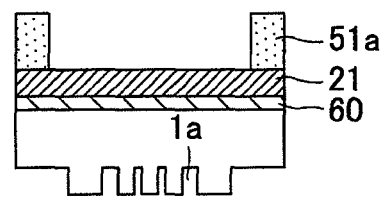
Figure 9C:
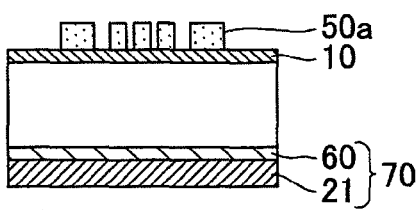

Then, the photomask blank was turned upside down and, using a laser writing apparatus, a desired light-shielding band pattern was written on a resist film 51 and then developed, thereby forming a resist pattern 51a (FIG. 9G).

Figure 9H:
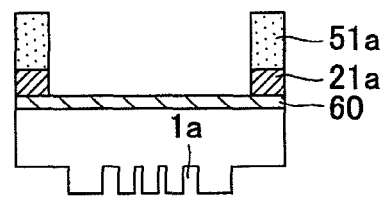
Figure 9D:
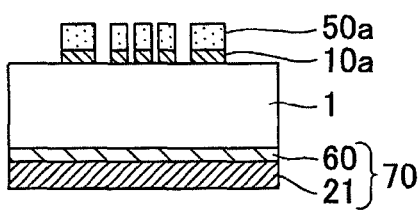

Then, using the resist pattern 51a as a mask, the MoSiON layer and the MoSi layer of the light-shielding film 21 were dry-etched with a mixed gas of $SF_6$ and He, thereby forming a light-shielding film pattern 21a (FIG. 9H).

Figure 9I:
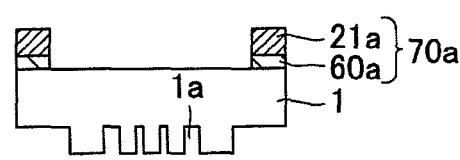
Figure 9E:
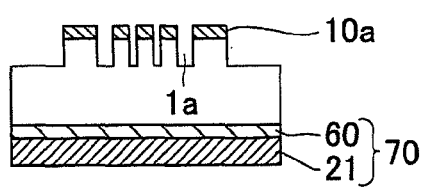
Figure 9J:
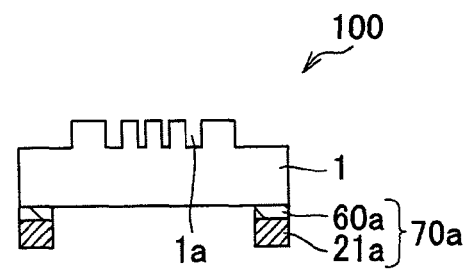

Then, the remaining resist pattern 51a was stripped and removed by a chemical solution. Then, using the light-shielding film pattern 21a as a mask, the etching stopper film 60 was dry-etched with a mixed gas of $Cl_2$ and $O_2$ ($Cl_2$:$O_2$=4:1), thereby forming an etching stopper film pattern 60a (FIG. 9I). Consequently, there was formed a light-shielding band 70a comprising the light-shielding film pattern 21a and the etching stopper film pattern 60a (FIG. 9I).

Finally, cleaning was carried out, thereby obtaining a photomask 100 (FIG. 9J).
[Evaluation]

The photomask thus obtained was evaluated.

As a result, in the photomask according to Example 6, the shift amount of CD (Critical Dimension) of the phase shift pattern (phase shift part) of the substrate dug-down type with respect to CD of the etching mask film pattern 10a was 4 nm.

The optical density of the light-shielding band 70a was OD=3 or more and thus OD≧3 was sufficiently ensured.

Further, with respect to the resolution of the phase shift pattern (phase shift part) of the substrate dug-down type formed on the photomask, it was possible to resolve a phase shift film pattern of 50 nm.

In view of the above, there was obtained the photomask applicable to the hp45 nm generation and further to the hp32 nm to 22 nm generations.

In Example 6, the etching stopper film 60 was provided between the light-transmitting substrate 1 and the light-shielding film 21. This is because when the light-shielding film 21 is made of a material, typified by molybdenum silicide, which is etched using a fluorine-based gas, it is necessary to protect the light-transmitting substrate 1 during dry etching of the light-shielding film 21 so as not to be etched with the fluorine-based gas. Accordingly, this configuration of Example 6 is particularly effective when a material to be etched using a fluorine-based gas is used as the light-shielding film 21.

In Example 6, the description has been given about the photomask having the phase shift part of the substrate dug-down type and the photomask blank for fabricating such a photomask, but it is also applicable to the case where a light-shielding film and a light-shielding band are made of a material mainly containing molybdenum in each of the photomasks having the phase shift parts described in Examples 2 to 4 and each of the photomask blanks for fabricating such photomasks.

In the photomask manufacturing processes of Example 6, the resist film 50 on the phase shift part forming side and the resist film 51 on the back-surface light-shielding band forming side were both coated at the initial stage. Instead of this, it may be configured such that the resist film 50 is first coated on the phase shift part forming side and the formation of the phase shift part is carried out in advance, and then the resist film 51 is coated on the back-surface light-shielding band forming side and the formation of the back-surface light-shielding band is carried out. This is particularly effective when the distance is long between the place where the process of coating the resist film 50 or 51 is carried out and the place where the process of forming the phase shift part or the back-surface light-shielding band is carried out (when the photomask blank transfer distance is long).

Comparative Example 1

Comparative Example 1 relates to a method of manufacturing a photomask blank for use in fabricating a phase shift mask of the type having a phase shift part of the substrate dug-down type and further relates to a method of manufacturing the photomask.

Figure 10:
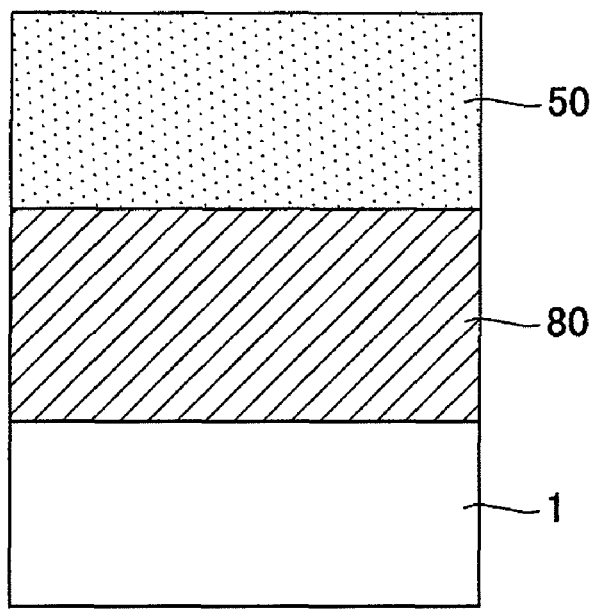
FIG. 10 is an exemplary sectional view showing one example of a photomask blank according to Comparative Example 1.

FIG. 10 shows one example of a photomask blank according to Comparative Example 1. This photomask blank has, on a light-transmitting substrate 1, a light-shielding film 80 being a layer serving as an etching mask film and adapted for forming a light-shielding band.

[Manufacture of Photomask Blank]

Referring to FIGS. 12A to 12H, a description will be given of photomask blank and photomask manufacturing methods according to Comparative Example 1.

Figure 12A:
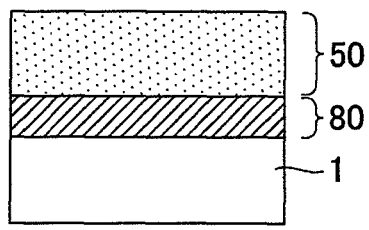
FIGS. 12A to 12H are exemplary sectional views for explaining photomask manufacturing processes according to Comparative Example 1.

A light-shielding film 80 for light-shielding band formation serving also as an etching mask film and comprising a CrN layer, a CrC layer, and a CrON layer was formed on a light-transmitting substrate 1 using an in-line type sputtering apparatus in which a plurality of chromium (Cr) targets were disposed in a chamber (FIG. 12A).

Specifically, first, reactive sputtering was carried out in a mixed gas atmosphere of argon (Ar) and nitrogen ($N_2$) (Ar:$N_2$=72:28 [vol %]; pressure: 0.3 [Pa]), thereby forming a CrN layer. Subsequently, reactive sputtering was carried out in a mixed gas atmosphere of argon (Ar) and methane ($CH_4$) (Ar:$CH_4$=96.5:3.5 [vol %]; pressure: 0.3 [Pa]), thereby forming a CrC layer. Subsequently, reactive sputtering was carried out in a mixed gas atmosphere of argon (Ar) and nitrogen monoxide (NO) (Ar:NO=87.5:12.5 [vol %]; pressure: 0.3 [Pa]), thereby forming a CrON layer on the CrC layer. The light-shielding film 80 in the form of the three-layer laminated film was continuously formed using the in-line type sputtering apparatus and thus configured such that the components thereof continuously changed in a thickness direction thereof. The total thickness of the light-shielding film 80 was 73 nm. The light-shielding film 80 exhibited an OD of 3.5 or more for ArF exposure light (wavelength: 193 nm).

[Manufacture of Photomask]

Then, as shown in FIG. 12A, a resist film 50 of a chemically amplified positive resist for electron beam writing (exposure) (PRL009: manufactured by FUJIFILM Electronic Materials Co., Ltd.) was coated to a thickness of 300 nm on the light-shielding film 80 by a spin-coating method.

Figure 12E:
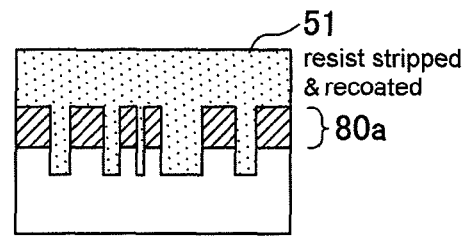
Figure 12B:
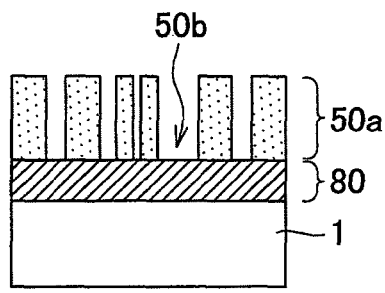

Then, using an electron beam writing apparatus, a desired pattern (50 nm-resolution pattern adapted to the hp45 nm generation) was written on the resist film 50 and, thereafter, development was carried out using a predetermined developer, thereby forming a resist pattern 50a (FIG. 12B).

Figure 12F:
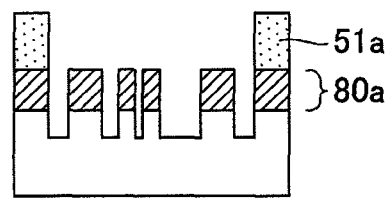
Figure 12C:
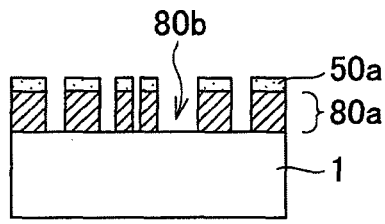

Then, using the resist pattern 50a as a mask, the light-shielding film 80 was dry-etched, thereby forming a light-shielding film pattern 80a (FIG. 12C). In this event, a mixed gas of $Cl_2$ and $O_2$ ($Cl_2$:$O_2$=4:1) was used as a dry etching gas.

Figure 12G:
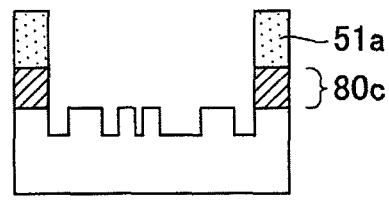
Figure 12D:
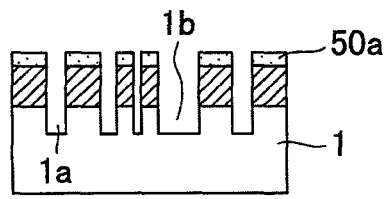

Then, using the resist pattern 50a and the light-shielding film pattern 80a as a mask, the light-transmitting substrate 1 was dry-etched with a mixed gas of $CHF_3$ and He, thereby obtaining a phase shift pattern (phase shift part) of the substrate dug-down type (FIG. 12D). In this event, the light-transmitting substrate 1 was etched to a depth adapted to obtain a phase difference of 180° for ArF exposure light (193 nm) (specifically, a depth of 170 nm), thereby forming a dug-down part 1a on the light-transmitting substrate 1 to provide the phase shift pattern (phase shift part).

Then, the resist pattern 50a was stripped and then a resist film 51 of a positive resist for laser writing (exposure) (THMR-IP3500: manufactured by Tokyo Ohka Kogyo Co., Ltd.) was coated to a thickness of 465 nm on the light-shielding film pattern 80a by the spin-coating method (FIG. 12E).

Then, using a laser writing apparatus, a light-shielding band pattern was written on the resist film 51 and then developed with a predetermined developer, thereby forming a resist pattern 51a (FIG. 12F).

Then, using the resist pattern 51a as a mask, the light-shielding film pattern 80a was dry-etched with a mixed gas of $Cl_2$ and $O_2$ ($Cl_2$:$O_2$=4:1), thereby forming a light-shielding band 80c (FIG. 12G).

Figure 12H:
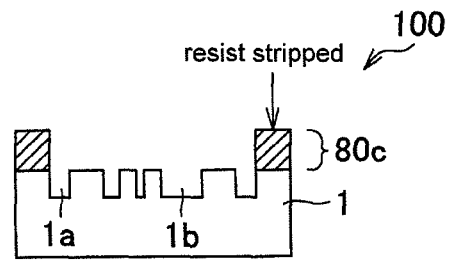

Finally, the resist pattern 51a was stripped and then cleaning was carried out, thereby obtaining a photomask 100 having the light-shielding band 80c on the front surface side of the substrate (FIG. 12H).

[Evaluation]

The photomask thus obtained was evaluated.

As a result, in the photomask according to Comparative Example 1, a pattern error part 1b occurred at a portion of the phase shift pattern (phase shift part) of the substrate dug-down type. This is caused by the fact that resist collapse and resist stripping occurred during development due to a high aspect ratio (ratio of the resist height to the resist width) of the resist pattern 50a at a fine-line pattern portion, leading to the occurrence of a stripped part 50b. Thus, a pattern defective part 80b occurred in the light-shielding film pattern 80a and, as a result of dry-etching the substrate 1 using the light-shielding film pattern 80a as an etching mask pattern, the pattern error part 1b was dug down. Further, since the thickness of the light-shielding film pattern 80a serving also as an etching mask pattern was as thick as 73 nm, there occurred a portion where the digging depth of the phase shift pattern 1a was not enough to produce the phase shift effect. In view of the above, with respect to the resolution of the phase shift pattern (phase shift part) of the substrate dug-down type formed on the photomask, it was found that the resolution of the phase shift film pattern was difficult.

The optical density of the light-shielding band 80c was OD=3.5 or more and thus OD≧3 was sufficiently ensured.

Consequently, it was found that, with the photomask blank of Comparative Example 1, it was difficult to obtain a photomask suitable for the hp45 nm generation and further the hp32 nm to 22 nm generations.

Comparative Example 2

Comparative Example 2 relates to a method of manufacturing a photomask blank for use in fabricating a phase shift mask of the type in which a substrate is not dug down and a high-transmittance phase shift part film pattern is formed by providing a high-transmittance halftone phase shift film, and further relates to a method of manufacturing the photomask.

Figure 11:
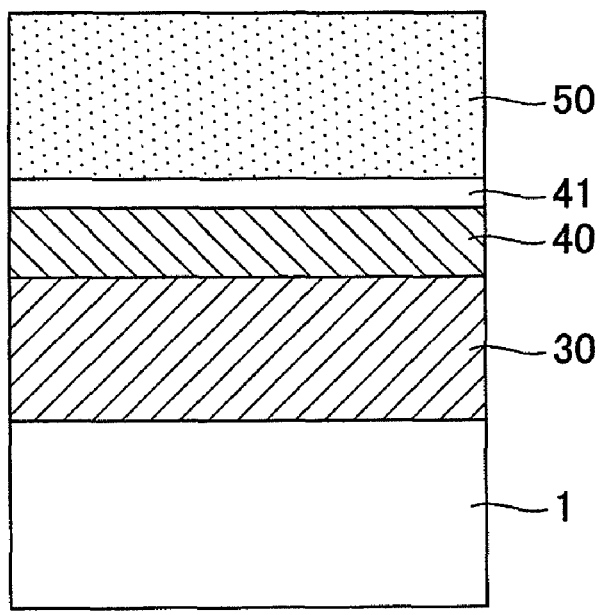
FIG. 11 is an exemplary sectional view showing one example of a photomask blank according to Comparative Example 2.

FIG. 11 shows one example of a photomask blank according to Comparative Example 2. This photomask blank comprises a halftone phase shift film 30, a light-shielding film 40 being a layer serving as an etching mask film and adapted for forming a light-shielding band, an etching mask film 41 for the light-shielding film 40, and a resist film 50 formed in this order on a light-transmitting substrate 1.

[Manufacture of Photomask Blank]

Referring to FIG. 11, a description will be given of a photomask blank manufacturing method according to Comparative Example 2.

First, using a mixed target of molybdenum (Mo) and silicon (Si) (Mo:Si=1:9 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based light-semitransmitting phase shift film 30 having a thickness of 69 nm on the front surface side of the light-transmitting substrate 1 (FIG. 11). In this event, the thickness of the phase shift film 30 was adjusted so as to obtain a phase difference of 180°. The transmittance of the phase shift film 30 for ArF exposure light (wavelength: 193 nm) was 6%. The phase shift film 30 exhibited an OD of 1.2 for ArF exposure light (wavelength: 193 nm).

Then, a light-shielding film 40 for light-shielding band formation serving also as an etching mask film and comprising a CrN layer, a CrC layer, and a CrON layer was formed on the phase shift film 30 using an in-line type sputtering apparatus in which a plurality of chromium (Cr) targets were disposed in a chamber (FIG. 11).

Specifically, first, reactive sputtering was carried out in a mixed gas atmosphere of argon (Ar), nitrogen ($N_2$), and helium (He) (Ar:$N_2$:He=30:30:40 [vol %]; pressure: 0.17 [Pa]), thereby forming a CrN layer. Subsequently, reactive sputtering was carried out in a mixed gas atmosphere of argon (Ar), methane ($CH_4$), and helium (He) (Ar:$CH_4$:He=49:11:40 [vol %]; pressure: 0.52 [Pa]), thereby forming a CrC layer. Subsequently, reactive sputtering was carried out in a mixed gas atmosphere of argon (Ar) and nitrogen monoxide (NO) (Ar:NO=90:10 [vol %]; pressure: 0.52 [Pa]), thereby forming a CrON layer on the CrC layer. The light-shielding film 40 in the form of the three-layer laminated film was continuously formed using the in-line type sputtering apparatus and thus configured such that the components thereof continuously changed in a thickness direction thereof. The total thickness of the light-shielding film 40 was 48 nm. The light-shielding film 40 exhibited an OD of 1.9 for ArF exposure light (wavelength: 193 nm).

Then, using a single-wafer sputtering apparatus, an etching mask film 41 was formed on the light-shielding film 40 (FIG. 11). Specifically, using a Si target, reactive sputtering was carried out in a mixed gas atmosphere of argon (Ar), nitrogen ($N_2$), and oxygen ($O_2$), thereby forming SiON to a thickness of 15 nm.

The sheet resistance was measured for the sample at the stage where the etching mask film 41 was formed, and it was 100 Ω/square.

Then, as shown in FIG. 11, a resist film 50 of a chemically amplified positive resist for electron beam writing (exposure) (PRL009: manufactured by FUJIFILM Electronic Materials Co., Ltd.) was coated to a thickness of 250 nm on the etching mask film 41 by a spin-coating method.

[Manufacture of Photomask]

Figure 13A:
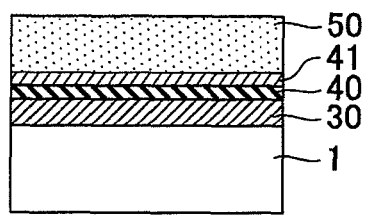
FIGS. 13A to 13I are exemplary sectional views for explaining photomask manufacturing processes according to Comparative Example 2.
Figure 13F:
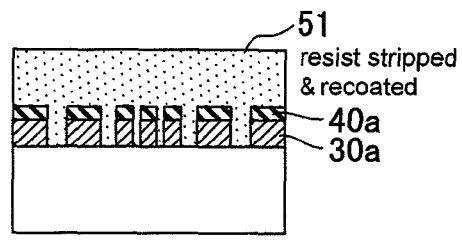
Figure 13B:
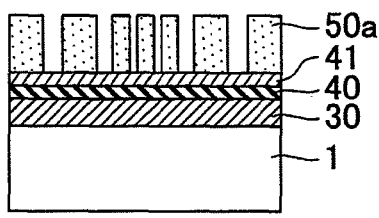

Using a photomask blank thus fabricated as shown in FIG. 13A, a desired pattern was written on the resist film 50 by the use of an electron beam writing apparatus and then development was carried out using a predetermined developer, thereby forming a resist pattern 50*a* (FIG. 13B).

Figure 13G:
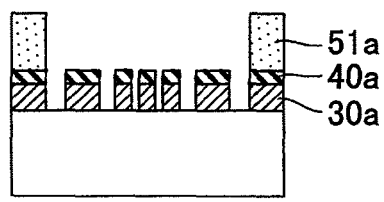
Figure 13C:
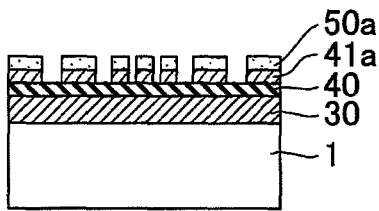

Then, using the resist pattern 50*a* as a mask, the etching mask film 41 was dry-etched, thereby forming an etching mask film pattern 41*a* (FIG. 13C). In this event, a mixed gas of $SF_6$ and He was used as a dry etching gas.

Figure 13H:
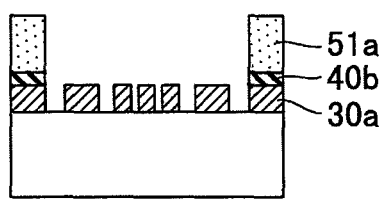
Figure 13D:
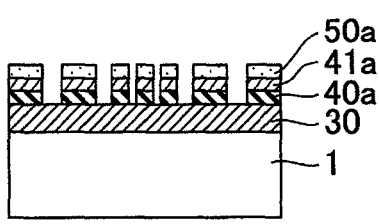

Then, using the resist pattern 50*a* and the etching mask film pattern 41*a* as a mask, the light-shielding film 40 was dry-etched, thereby forming a light-shielding film pattern 40*a* (FIG. 13D). In this event, a mixed gas of $Cl_2$ and $O_2$ ($Cl_2$:$O_2$=4:1) was used as a dry etching gas.

Figure 13I:
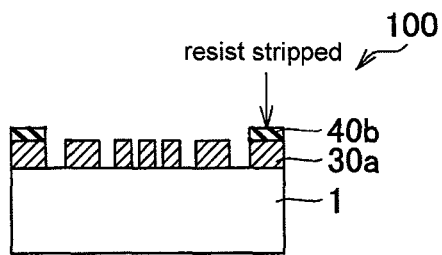
Figure 13E:
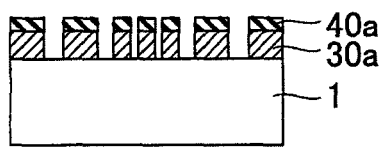

Then, the resist pattern 50*a* was stripped and, using the light-shielding film pattern 40*a* as a mask, the phase shift film 30 was dry-etched with a mixed gas of $SF_6$ and He, thereby forming a phase shift film pattern 30*a* (FIG. 13E). By this dry etching, the etching mask film pattern 41*a* was simultaneously stripped.

Then, a resist film 51 of a positive resist for laser writing (exposure) (THMR-IP3500: manufactured by Tokyo Ohka Kogyo Co., Ltd.) was coated to a thickness of 465 nm on the light-shielding film pattern 40*a* by the spin-coating method (FIG. 13F).

Then, using a laser writing apparatus, a light-shielding band pattern was written on the resist film 51 and then developed with a predetermined developer, thereby forming a resist pattern 51*a* (FIG. 13G). Then, using the resist pattern 51*a* as a mask, the light-shielding film pattern 40*a* was dry-etched with a mixed gas of $Cl_2$ and $O_2$ ($Cl_2$:$O_2$=4:1), thereby forming a light-shielding band 40*b* (FIG. 13H).

Finally, the resist pattern 51*a* was stripped and then cleaning was carried out, thereby obtaining a photomask 100 having the light-shielding band on the front surface side of the substrate (FIG. 13I).

[Evaluation]

The photomask thus obtained was evaluated.

As a result, in the photomask according to Comparative Example 2, the shift amount of CD (Critical Dimension) of the MoSiN-based halftone phase shift film pattern 30*a* with respect to CD of the light-shielding film pattern 40*a* was 5 nm.

The optical density of the light-shielding band as the total optical density of the light-shielding film pattern 40*a* and the phase shift film pattern 30*a* was OD=3.1.

Further, with respect to the resolution of the transfer pattern formed on the photomask, it was difficult to resolve the MoSiN-based halftone phase shift film pattern 30*a* of 50 nm.

In view of the above, it was not possible to obtain a photomask suitable for the hp45 nm generation and further the hp32 nm to 22 nm generations.

For the generations prior to the hp45 nm generation, it is possible to form a main pattern with no problem in CD accuracy and it is also possible to ensure OD≧3 of the light-shielding band according to the method described in Comparative Example 2. Therefore, it is reasonable to form a light-shielding band using a metal etching mask layer (to form a layer serving as both a metal etching mask layer and a light-shielding band forming layer) for the generations prior to the hp45 nm generation.

While this invention has been described with reference to the embodiments and Examples, the technical scope of the invention is not limited to the scope of the description of the above embodiments and Examples. It is obvious to a person skilled in the art that various changes or improvements can be added to the above embodiments and Examples. It is clear from the description of claims that the modes added with such changes or improvements can also be included in the technical scope of this invention.

What is claimed is:

1. A photomask blank for manufacturing a phase shift mask having a light-transmitting substrate provided with a phase shift part adapted to give a predetermined phase difference to transmitted exposure light, wherein the phase shift part is a dug-down part that is dug down from a surface of the light-transmitting substrate to a digging depth adapted to produce the predetermined phase difference with respect to exposure light transmitted through the light-transmitting substrate at a portion where the phase shift part is not provided, the photomask blank comprising:

an etching mask film, on the digging-side surface of the light-transmitting substrate, that is made of a material being dry-etchable with a chlorine-based gas, but not dry-etchable with a fluorine-based gas, and serves as an etching mask at least until the digging depth is reached when forming the dug-down part; and a light-shielding film, on an opposite-side surface of the light-transmitting substrate, that forms, by etching, a light-shielding part adapted to shield exposure light transmitted through the light-transmitting substrate in a region other than a transfer pattern region, wherein the light-shielding film comprises a portion that contacts with the opposite-side surface of the light-transmitting substrate and that is formed by a material having an etch resistance with respect to the light-transmitting substrate.

2. A photomask blank for manufacturing a phase shift mask having a light-transmitting substrate provided with a phase shift part adapted to give a predetermined phase difference to transmitted exposure light, wherein the phase shift part is a phase shift film adapted to give a predetermined phase change amount to the transmitted exposure light, the photomask blank comprising:

an etching mask film, on a surface of the phase shift film, that is made of a material being dry-etchable with a chlorine-based gas, but not dry-etchable with a fluorine-based gas, and serves as an etching mask at least until a transfer pattern is formed in the phase shift film by dry etching with a fluorine-based gas; and a light-shielding film, on an opposite-side surface of the light-transmitting substrate, that forms, by etching, a light-shielding part adapted to shield exposure light transmitted through said light-transmitting substrate in a region other than a transfer pattern region, wherein the light-shielding film comprises a portion that contacts with the opposite-side surface of the light-transmitting substrate and that is formed by a material having an etch resistance with respect to the light-transmitting substrate.

3. The photomask blank according to claim 1 or 2, wherein the light-shielding film is made of a material being wet-etchable with an etchant to which the light-transmitting substrate has etching resistance.

4. The photomask blank according to claim 1 or 2, wherein the light-shielding film is made of a material mainly containing one of chromium, chromium nitride, chromium oxide, chromium oxynitride, and chromium oxycarbonitride.

5. The photomask blank according to claim 1 or 2, wherein the light-shielding film has a thickness of 60 nm to 100 nm.

6. The photomask blank according to claim 1 or 2, wherein the etching mask film is made of a material mainly containing one of chromium, chromium nitride, chromium oxide, chromium oxynitride, and chromium oxycarbonitride.

7. The photomask blank according to claim 1 or 2, wherein the etching mask film has a thickness of 5 nm to 40 nm.

8. The photomask blank according to claim 2, wherein the phase shift film is made of a material mainly containing one of molybdenum silicide, molybdenum silicide nitride, molybdenum silicide oxide, and molybdenum silicide oxynitride.

9. The photomask blank according to claim 2, wherein the phase shift film comprises:

a phase adjusting layer made of a material mainly containing silicon oxide or silicon oxynitride; and a transmittance adjusting layer made of a material mainly containing tantalum or a tantalum-hafnium alloy.

10. A photomask manufactured using the photomask blank according to claim 1 or 2.

11. A photomask manufacturing method using the photomask blank according to claim 1, the method comprising the steps of:

etching the light-shielding film using a resist film pattern as a mask, thereby forming the light-shielding part in the region other than the transfer pattern region;

dry-etching the etching mask film using a resist film pattern as a mask, thereby forming an etching mask film pattern; and dry-etching the light-transmitting substrate using the etching mask film pattern as a mask, thereby forming the dug-down part that is dug down from the surface of the light-transmitting substrate to the digging depth adapted to produce the predetermined phase difference.

12. A photomask manufacturing method using the photomask blank according to claim 2, the method comprising the steps of:

etching the light-shielding film using a resist film pattern as a mask, thereby forming the light-shielding part in the region other than the transfer pattern region;

dry-etching the etching mask film using a resist film pattern as a mask, thereby forming an etching mask film pattern; and dry-etching the phase shift film using the etching mask film pattern as a mask, thereby forming a phase shift film pattern.

13. The photomask blank according to claim 1 or 2, wherein each of the etching mask film and the light-shielding film is formed of a material containing the same metal.

14. The photomask blank according to claim 1 or 2, wherein the light-shielding film is formed of a material mainly containing tantalum.

15. A phase shift mask, comprising:

a light-transmitting substrate;

a phase shift part formed in a transfer pattern region of a surface of the light-transmitting substrate and adapted to give a predetermined phase difference to transmitted exposure light; and a light-shielding part formed on an opposite-side surface of the light-transmitting substrate and adapted to shield exposure light transmitted through the light-transmitting substrate in a region other than the transfer pattern region;

wherein the light-shielding part is made of the light-shielding film, and the light-shielding film comprises a portion that contacts with the opposite-side surface of the light-transmitting substrate and that is formed by a material having an etch resistance with respect to the light-transmitting substrate.

16. The phase shift mask according to claim 15, wherein the phase shift part comprises a dug-down part that is dug down from a surface of the light-transmitting substrate to a digging depth adapted to produce the predetermined phase difference with respect to exposure light transmitted through the light-transmitting substrate at a portion where the phase shift part is not provided.

17. The phase shift mask according to claim 15, wherein the phase shift part comprises a phase shift film adapted to give a predetermined phase change amount to the transmitted exposure light.

18. The phase shift mask according to claim 15, wherein the light-shielding film is made of a material mainly containing one of chromium, chromium nitride, chromium oxide, chromium oxynitride, and chromium oxycarbonitride or a material mainly containing tantalum.

* * * * *